(12) United States Patent
Sung et al.

(10) Patent No.: US 10,895,621 B2
(45) Date of Patent: Jan. 19, 2021

(54) METHOD AND APPARATUS FOR ACCURATE PARAMETRIC MAPPING

(71) Applicant: THE REGENTS OF THE UNIVERSITY OF CALIFORNIA, Oakland, CA (US)

(72) Inventors: Kyung Sung, Los Angeles, CA (US); Holden Wu, Los Angeles, CA (US); Novena Rangwala, Los Angeles, CA (US)

(73) Assignee: THE REGENTS OF THE UNIVERSITY OF CALIFORNIA, Oakland, CA (US)

(*) Notice: Subject to any disclaimer, the term of this patent is extended or adjusted under 35 U.S.C. 154(b) by 129 days.

(21) Appl. No.: 16/173,773

(22) Filed: Oct. 29, 2018

(65) Prior Publication Data

US 2019/0128984 A1 May 2, 2019

Related U.S. Application Data

(63) Continuation of application No. PCT/US2017/030598, filed on May 2, 2017.
(Continued)

(51) Int. Cl.
*G01R 33/56* (2006.01)
*G01R 33/24* (2006.01)
(Continued)

(52) U.S. Cl.
CPC ....... *G01R 33/5608* (2013.01); *G01R 33/246* (2013.01); *G01R 33/50* (2013.01);
(Continued)

(58) Field of Classification Search
CPC .. G01R 33/246; G01R 33/50; G01R 33/5608; G06T 7/136; G06T 7/11; G06T 7/97; G06T 7/0014; G06T 3/4007
See application file for complete search history.

(56) References Cited

U.S. PATENT DOCUMENTS 9,494,668 B2* 11/2016 Bottomley .............. G01R 33/54
9,672,616 B2* 6/2017 Raschke ............... G06T 7/0012
(Continued)

FOREIGN PATENT DOCUMENTS

WO 2017192557 A1 11/2017

OTHER PUBLICATIONS

Sung, Kyunghyun et al., "Simultaneous T1 and B1+ Mapping using Reference Region Variable Flip Angle Imaging", Magn Reson Med. Oct. 2013; 70(4): 954-961, Author Manuscript, PMC Oct. 1, 2014, pp. 1-16.
(Continued)

*Primary Examiner* — Dixomara Vargas
(74) *Attorney, Agent, or Firm* — O'Banion & Ritchey LLP; John P. O'Banion

(57) ABSTRACT

Systems and methods are disclosed for a simultaneous 3D $T_1$ and $B_1^+$ mapping technique based on VFA imaging using a reference region VFA (RR-VFA) approach to eliminate the need for a separate $B_1^+$ mapping scan while imaging the prostate. The RR-VFA method assumes the existence of a "reference region" that is distributed throughout the volume of interest and is well characterized by a known $T_1$ relaxation time. In particular, fat is generally selected as the reference region due to its distribution in the body. $B_1^+$ inhomogeneity is estimated in the fat tissue and interpolated over the entire volume of interest, thus eliminating the need for an additional scan.

20 Claims, 14 Drawing Sheets

Related U.S. Application Data

(60) Provisional application No. 62/330,768, filed on May 2, 2016.

(51) Int. Cl.
    *G01R 33/50*     (2006.01)
    *G06T 7/136*     (2017.01)
    *G06T 7/11*     (2017.01)
    *G06T 7/00*     (2017.01)
    *G06T 3/40*     (2006.01)
    *G01R 33/48*     (2006.01)

(52) U.S. Cl.
CPC .......... *G06T 3/4007* (2013.01); *G06T 7/0014* (2013.01); *G06T 7/11* (2017.01); *G06T 7/136* (2017.01); *G06T 7/97* (2017.01); *G01R 33/4828* (2013.01); *G06T 2207/10096* (2013.01); *G06T 2207/30081* (2013.01)

(56) References Cited

U.S. PATENT DOCUMENTS

| | | | | |
|---|---|---|---|---|
| 2008/0108894 A1* | 5/2008 | Elgavish | ................ | G06T 19/00 600/420 |
| 2011/0201917 A1* | 8/2011 | Li | ................... | G01R 33/4828 600/410 |
| 2013/0141096 A1* | 6/2013 | Bottomley | ............ | G01R 33/54 324/309 |
| 2014/0058249 A1* | 2/2014 | Li | ........................ | A61B 5/4312 600/420 |
| 2016/0086326 A1* | 3/2016 | Raschke | ............... | G06T 7/0012 382/131 |
| 2016/0166229 A1* | 6/2016 | Matthews | .............. | A61B 6/037 600/431 |

OTHER PUBLICATIONS

Langer, Deanna Lyn, "Multi-parametric Resonance Imaging (MRI) in Prostate Cancer", University of Toronto, Graduate Department of the Institute of Medical Science, Thesis, 2010, 144 pages, available online at https://tspace.library.utoronto.ca/bitstream/1807/24802/1/Langer_Deanna_L_201006_PhD_thesis.pdf.

Berglund, Johan et al., "Two-point Dixon Method With Flexible Echo Times", Magnetic Resonance in Medicine 65:994-1004 (2011), pubished online Nov. 16, 2010 at https://onlinelibrary.wiley.com/doi/pdf/10.1002/mrm.22679.

Rangwala, Novena A. et al. "Optimization and Evaluation of Reference Region Variable Flip Angle (RR-VFA) B1+ and T1 Mapping in the Prostate at 3T", J. Magn. Reson. Imaging 2017; 45:751-760, Mar. 2017, published online Aug. 17, 2016 at https://onlinelibrary.wiley.com/doi/abs/10.1002/jmri.25410.

* cited by examiner $S_{F15}$ $S_{W15}$ $\dfrac{S_{F15}}{S_{F15}+S_{W15}} \times 100$ $A_{REF}$

M $A_{FAT}$ $M \cdot A_{REF}$ $|A_{FAT} - M \cdot A_{REF}|$, $\sigma = 4.78$

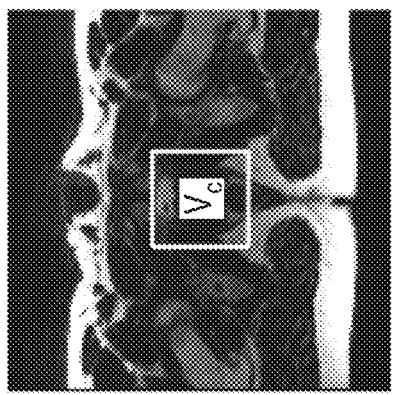
FIG. 11A $S_{F15}$
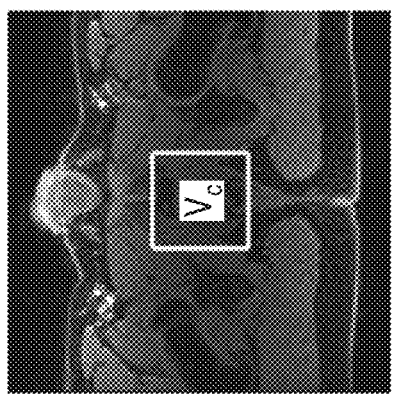
FIG. 11B $S_{W15}$
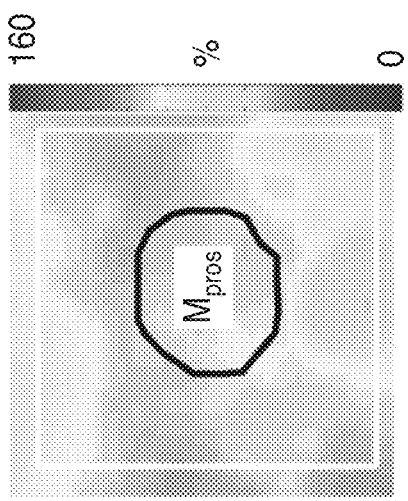
FIG. 11C $A_{REF}$
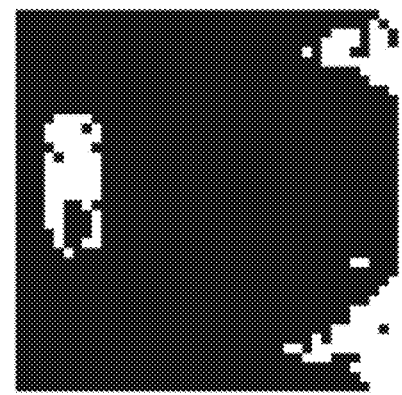
FIG. 11D M
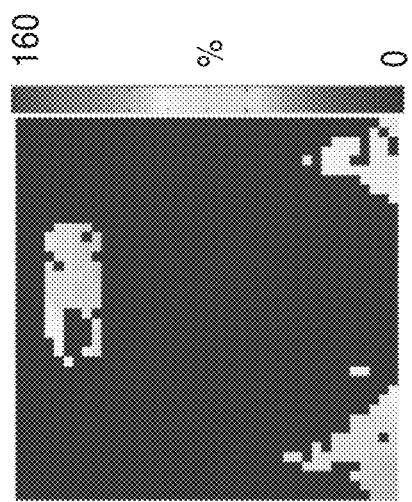
FIG. 11E $M \cdot A_{REF}$
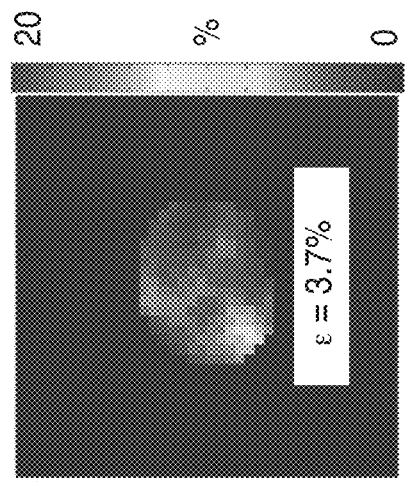
FIG. 11F $|A_{REF} - A_{interpl}| \cdot M_{pros}$

METHOD AND APPARATUS FOR ACCURATE PARAMETRIC MAPPING

CROSS-REFERENCE TO RELATED APPLICATIONS

This application claims priority to, and is a 35 U.S.C. § 111(a) continuation of, PCT international application number PCT/US2017/030598 filed on May 2, 2017, incorporated herein by reference in its entirety, which claims priority to, and the benefit of, U.S. provisional patent application Ser. No. 62/330,768 filed on May 2, 2016, incorporated herein by reference in its entirety. Priority is claimed to each of the foregoing applications.

The above-referenced PCT international application was published as PCT International Publication No. WO 2017/192557 on Nov. 9, 2017, which publication is incorporated herein by reference in its entirety.

STATEMENT REGARDING FEDERALLY SPONSORED RESEARCH OR DEVELOPMENT

Not Applicable

NOTICE OF MATERIAL SUBJECT TO COPYRIGHT PROTECTION

A portion of the material in this patent document may be subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. § 1.14.

BACKGROUND

1. Technical Field

The technology of this disclosure pertains generally to medical imaging, and more particularly to parametric mapping of tissue.

2. Background Discussion

Multi-parametric MRI (mp-MRI) continues to gain clinical acceptance as the preferred imaging technique for diagnosis and management of prostate cancer. A standard mp-MRI protocol includes $T_2$ and diffusion-weighted images (DWI), and dynamic contrast-enhanced MRI (DCE-MRI). With increased interest in quantitative mp-MRI, the estimation of pharmacokinetic parameters ($K^{trans}$, $k_{ep}$, and $v_e$) from DCE-MRI has shown its promise in tumor detection, staging, and the characterization of recurrence in prostate cancer. Measurement of pre-contrast $T_1$ relaxation time is an important initial step in quantitative DCE-MRI, where $T_1$ mapping is commonly performed using three-dimensional RF-spoiled gradient echo (also called Fast Low Angle Shot, FLASH) images with variable flip angles (VFA). However, $T_1$ measurements using VFA are susceptible to errors due to spatial variations in flip angle caused by transmit radiofrequency (RF), also known as $B_1^+$, field inhomogeneity.

$B_1^+$ field inhomogeneity is an important and persistent problem in MRI, and can potentially affect sequence design, quantitative parametric mapping, and measures involving signal intensity. MRI research is moving toward higher field strengths where $B_1^+$ homogeneity is worse and can compromise quantitative comparisons performed longitudinally or in a heterogeneous group of subjects (such as a patient population) or on several MRI scanners.

Due to gains in signal-to-noise ratio (SNR) at higher static magnetic field strengths ($B_0$), prostate cancer may be better characterized using quantitative DCE-MRI at 3T. However, the RF wavelength of dielectric resonances decreases with increasing $B_0$ field such that it is comparable to the dimensions of the human body, significantly worsening the $B_1^+$ field homogeneity, with as much as 30-50% variation in the abdomen. Since the $B_1^+$ field is dependent on the size and geometry of the subject, the $B_1^+$ inhomogeneity has to be measured on a subject-by-subject and scanner-by-scanner basis. Therefore, it is important to map and correct $B_1^+$ field variations for improved accuracy of $T_1$ mapping and eventually DCE-MRI at 3T.

A common approach to improving accuracy of VFA $T_1$ estimation is to map and correct the $B_1^+$ field inhomogeneity. The techniques for mapping $B_1^+$ field inhomogeneity primarily fall into two categories: magnitude-based methods or phase-based methods. Although these techniques can effectively characterize the $B_1^+$ field inhomogeneity, their clinical usability remains limited due to a combination of increased scan time, slice profile and position mismatch between 2D $B_1^+$ and 3D $T_1$ mapping sequences, and limited availability. Furthermore, various $B_1^+$ mapping techniques may have different performance characteristics, and it may not be practically possible to use the same $B_1^+$ mapping technique in a multi-scanner setting, which may lead to inter-scanner variations in $T_1$ estimation even after $B_1^+$ correction.

BRIEF SUMMARY

An aspect of the present description is a simultaneous 3D $T_1$ and $B_1^+$ mapping technique based on VFA imaging, referred to as reference region VFA (RR-VFA), to eliminate the need for a separate $B_1^+$ mapping scan while imaging the prostate. The RR-VFA method of the present description assumes the existence of a "reference region" that is distributed throughout the volume of interest and is well characterized by a known $T_1$ relaxation time. In particular, fat is generally selected as the reference region due to its distribution in the body. $B_1^+$ inhomogeneity is estimated in the fat tissue and interpolated over the entire volume of interest, thus eliminating the need for an additional scan.

Because the prostate is typically devoid of fat tissue, the techniques of the present description evaluate the relationship between the identification and characterization of the fat tissue surrounding the prostate and the quality of interpolation within the prostate. The systems and methods of the present description are configured to optimize the RR-VFA method for $B_1^+$ and $T_1$ mapping in the prostate at 3T by accurately identifying and characterizing the fat tissue using an optimized threshold calculation based on fat signal segmentation and signal fat fraction and a population-based value for fat $T_1$, ensuring interpolation accuracy in the prostate.

By way of example, and not of limitation, the technology presented in this disclosure comprises (a) an optimized Reference Region Variable Flip Angle (RR-VFA) approach, and (b) possible applications of the reference region concept and optimal selection of related parameters using the proposed metrics for other applications in medical imaging and/or image processing. More particularly, the technology relates to specific calibration and optimization techniques to extend the scope of RR-VFA $B_1^+$ mapping to other anatomies, e.g., the prostate. Further, the technique illustrates the concept of using a reference region with a known characteristic in a recognized model to estimate an unknown system parameter. It is appreciated that the techniques disclosed herein are an image processing methodology, and may be specifically configured to be applied beyond MRI, e.g. CT, ultrasound, radiograph, or other imaging modality.

The fat region surrounding the prostate is first identified using a fractional fat segmentation constant ($t_F$) and a signal fat-fraction threshold ($r_F$), and the relative flip angle (rFA) is characterized using an effective fat $T_1$ ($T_{1f}$) within the fat region. Optimal values of $t_F$, $r_F$ and $T_{1f}$ were chosen by comparing rFA maps using RR-VFA ($A_{RR-VFA}$) with a reference rFA map ($A_{REF}$) in the surrounding fat and evaluating interpolation errors within the prostate. The optimized RR-VFA was evaluated in volunteers at 3T on a single scanner (n=10) and across three scanners (n=4).

While the systems and methods disclosed herein are detailed with specific application of imaging the prostate, it is appreciated that other regions of the body, and in particular other non-fatty tissue regions or regions not having well-resolved or characterizable parameters, are contemplated.

Further aspects of the technology described herein will be brought out in the following portions of the specification, wherein the detailed description is for the purpose of fully disclosing preferred embodiments of the technology without placing limitations thereon.

BRIEF DESCRIPTION OF THE SEVERAL VIEWS OF THE DRAWING(S)

The technology described herein will be more fully understood by reference to the following drawings which are for illustrative purposes only:

Figure 1:
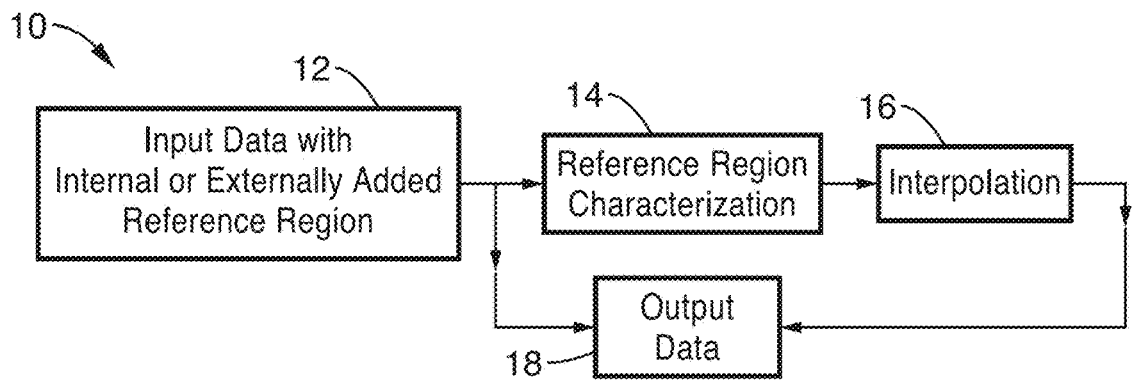
FIG. 1 shows a schematic flow diagram of a parametric mapping method 10 in accordance with the present invention.
Figure 8:
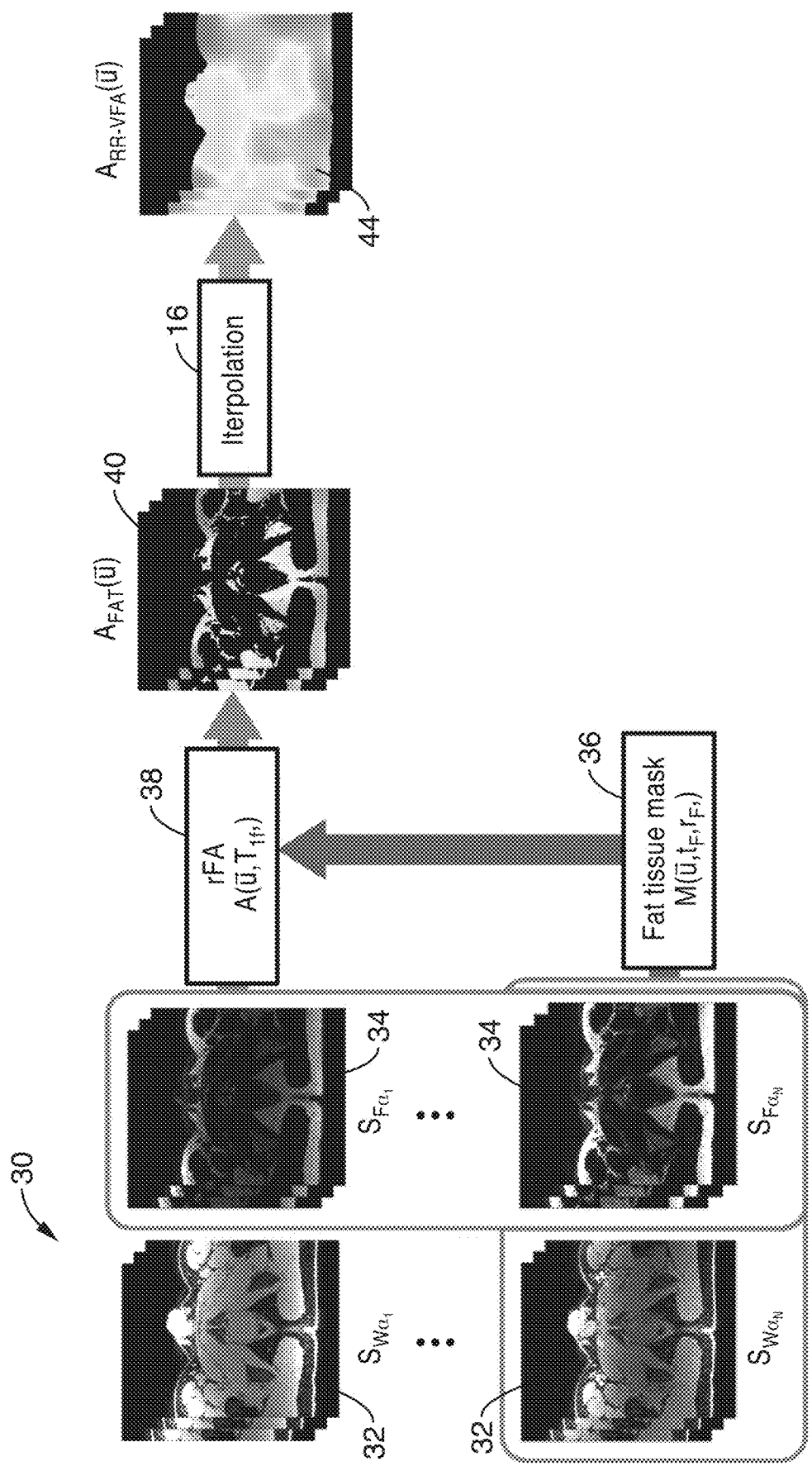
FIG. 8 shows a flow diagram of more detailed method for parametric mapping method in accordance with the present description.
Figure 9A:
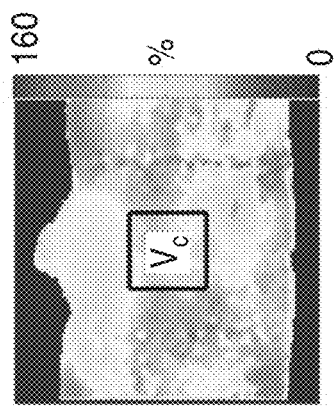
Figure 9B:
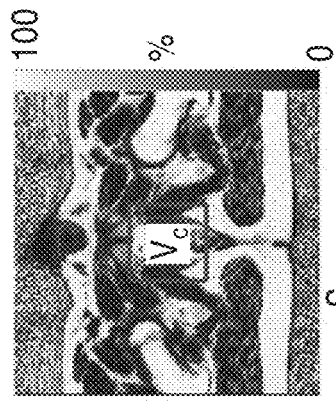
Figure 9C:
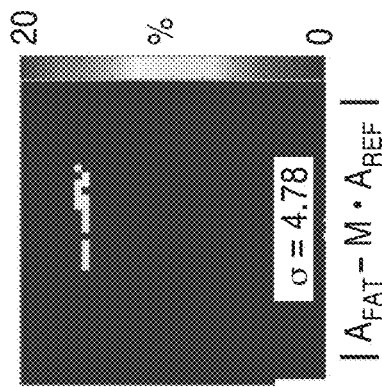
Figure 9D:
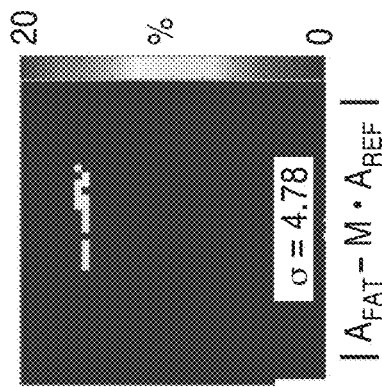
Figure 9E:
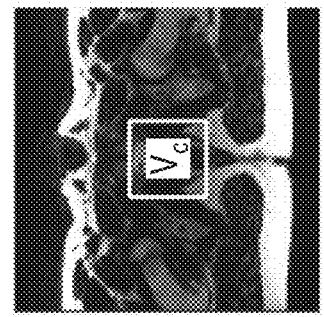
Figure 9F:
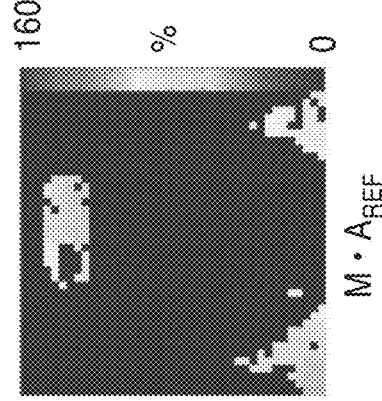
Figure 9G:
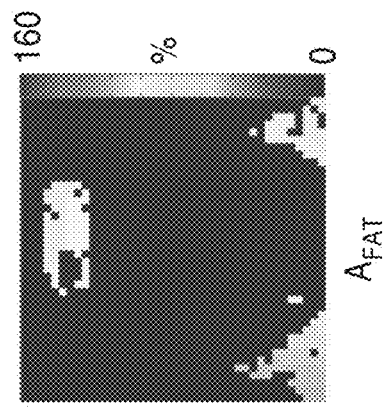
Figure 9H:
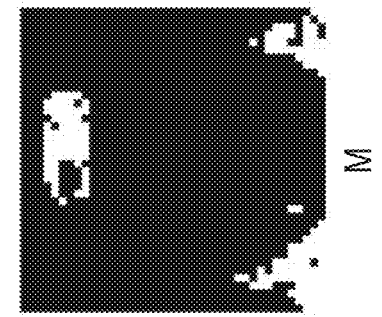

FIG. 9A through FIG. 9H illustrate the steps to calculate the fractional volume of outliers, δ used in the interpolation step of FIG. 1 and FIG. 8. FIG. 9A through FIG. 9D show Dixon-separated fat and water images, $S_{F15}$ (FIG. 9A) and $S_{W15}$ (FIG. 9B), signal fat fraction map (FIG. 9C), and $A_{REF}$ (FIG. 9D). The central volume, $V_C$, (center of the FOV in FIG. 9A through FIG. 9D), is shown in the second row (FIG. 9E through FIG. 9H). FIG. 9E shows the fat tissue mask M created with the values of $r_F$=90% and $t_F$=0.5, (FIG. 9E). FIG. 9F shows rFA within the fat tissue, $A_{FAT}$, computed using $T_{1f}$=320 ms. FIG. 9G shows a reference $B_1^+$ map, $M \cdot A_{REF}$. FIG. 9H shows the absolute difference between the images of 9F and 9G.

Figure 10A:
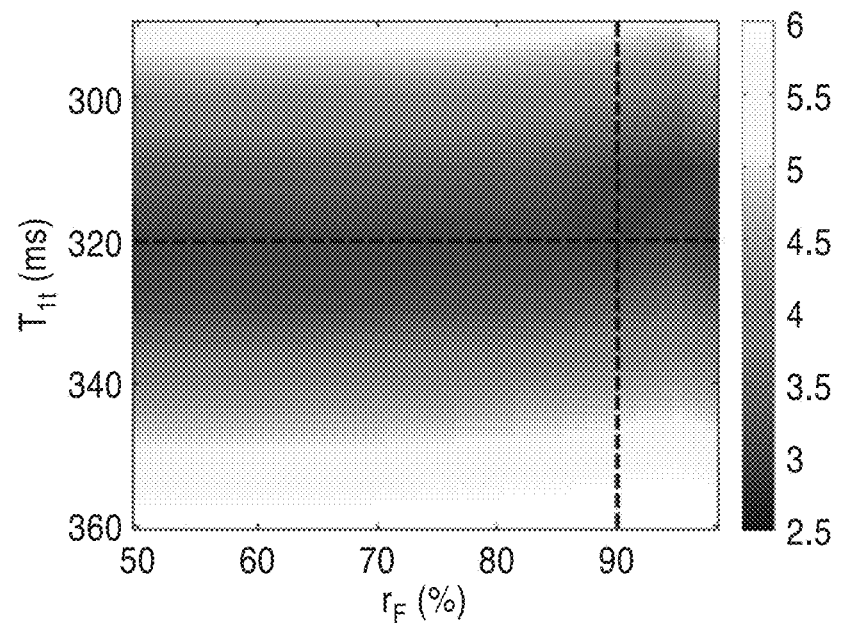
Figure 10B:
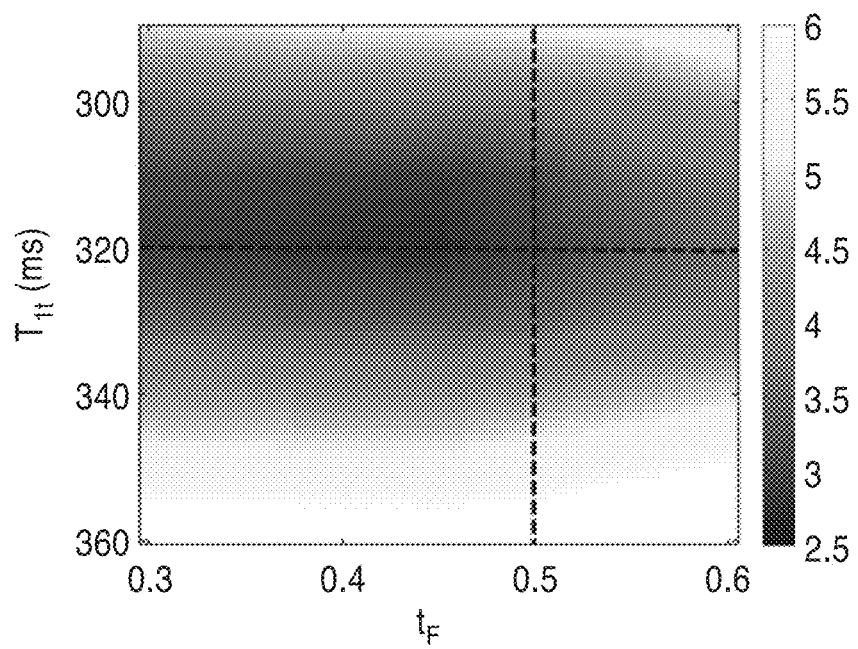
Figure 10C:
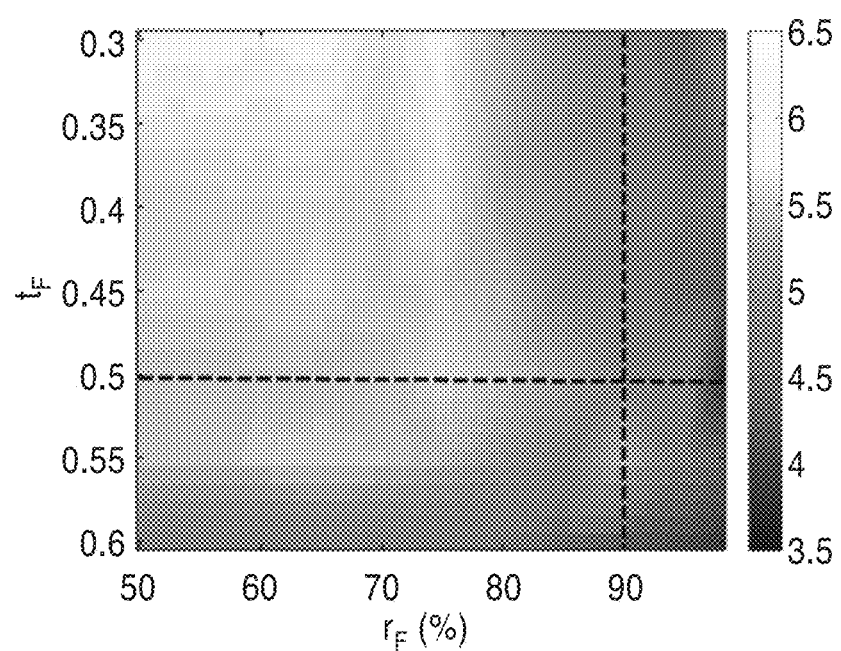

FIG. 10A through FIG. 10C are plots illustrating the variation between the two maps as a function of $t_F$, $r_F$ and $T_{1f}$. FIG. 10A shows the mean difference of rFA varying with $T_{1f}$ and $r_F$, and a constant $t_F$=0.5. FIG. FIG. 10B shows the mean difference of rFA as a function of $T_{1f}$ and $t_F$, and $r_F$ constant at 90%. FIG. 10C shows the dependence of the fractional volume, δ, on a combination of $t_F$ and $r_F$ when $T_{1f}$=320 ms.

FIG. 11A through FIG. 11F illustrate interpolation accuracy of the methods of the present description. FIG. 11A and FIG. 11B show images of $S_{F15}$ and $S_{W15}$, respectfully. FIG. 11C shows a central region of $A_{REF}$ for one volunteer. FIG. 11D shows a fat tissue mask M created using $t_F$=0.5 and $r_F$=90%. FIG. 11E shows in image of masked data $M \cdot A_{REF}$. FIG. 11F shows an image of the absolute difference image $|A_{REF} - A_{interp}| \cdot M_{pros}$.

Figure 12A:
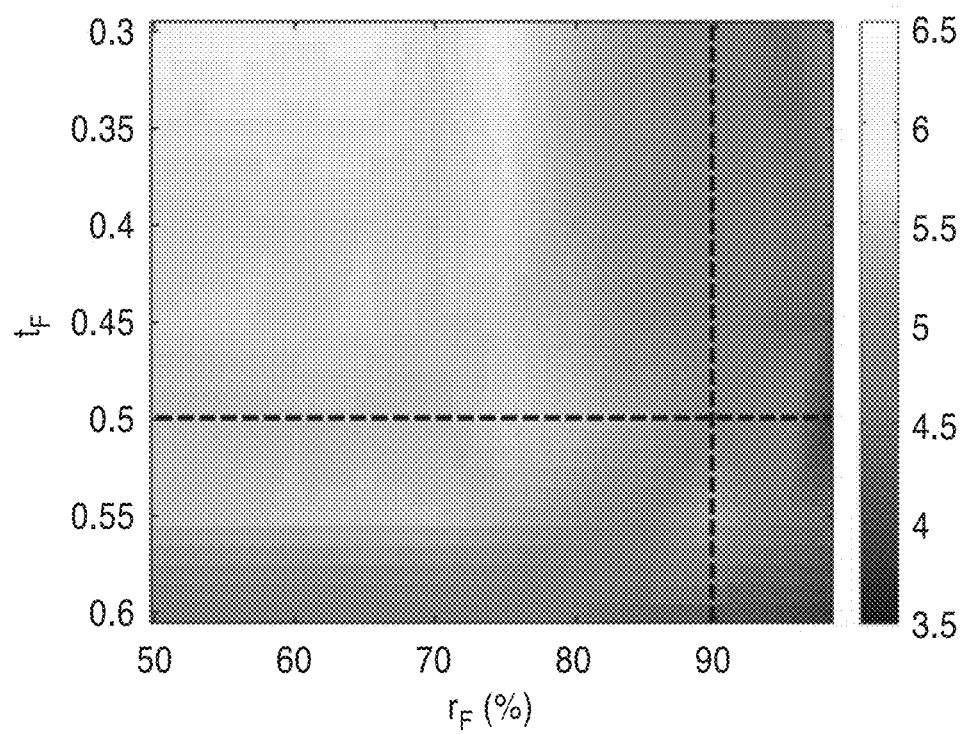
Figure 12B:
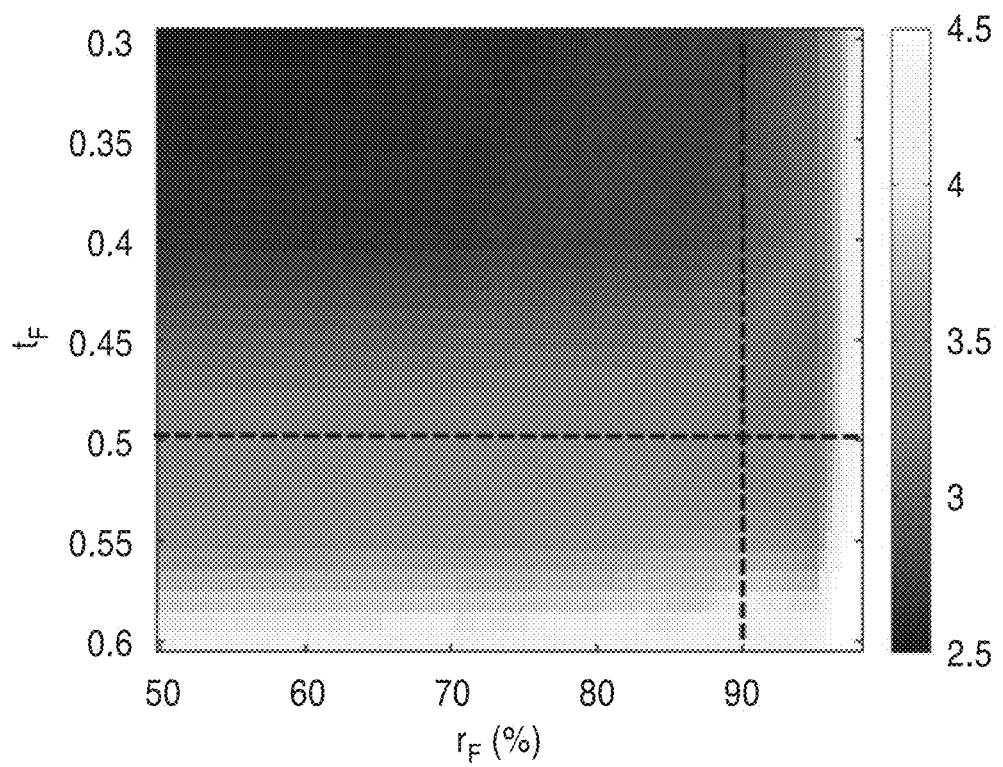
Figure 12C:
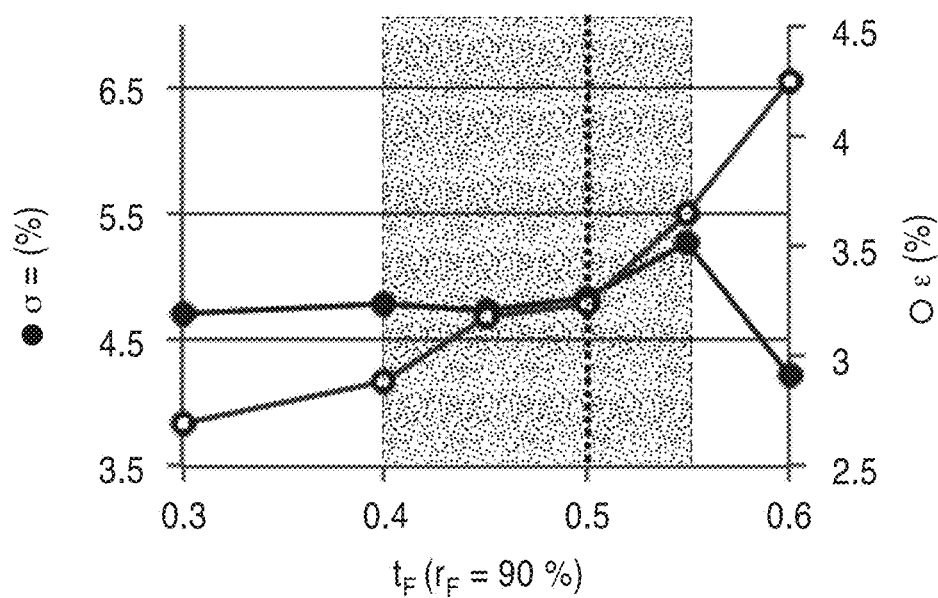
Figure 12D:
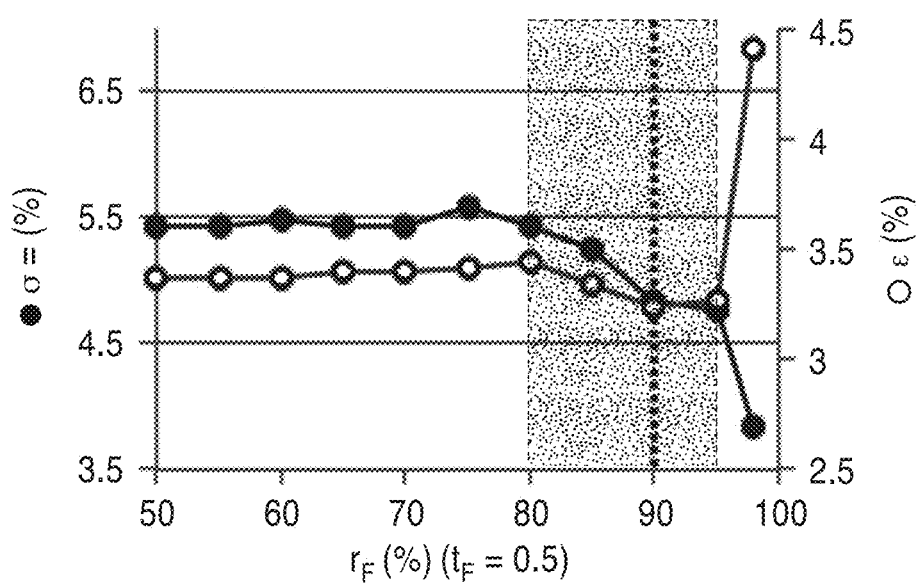

FIG. 12A through FIG. 12D are plots illustrating the effects of $t_F$ and $r_F$ when appropriately identifying the fat reference region. The fractional volume δ and the interpolation error ε are shown in FIG. 12A and FIG. 12B respectively. FIG. 12C and FIG. 12D show two cross-section plots when $r_F$=90% (FIG. 12C) and $t_F$=0.5 (FIG. 12D) with $T_{1f}$=320 ms, corresponding to the horizontal and vertical dotted lines.

Figure 13A:
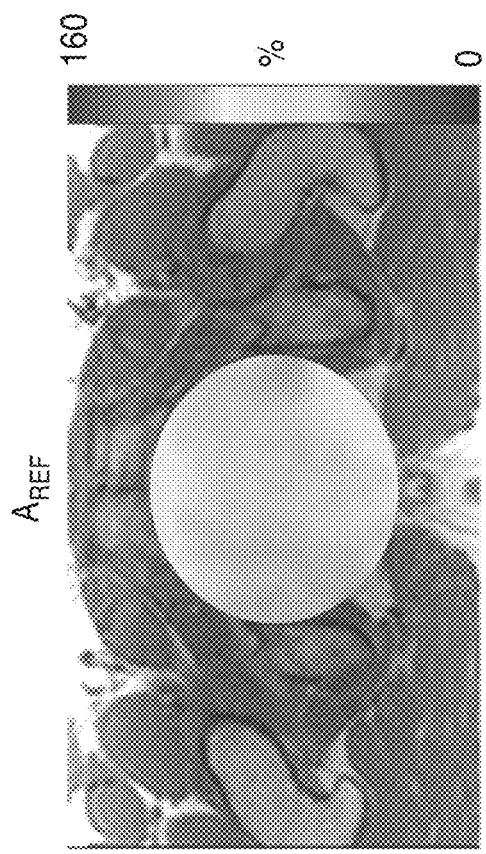
Figure 13B:
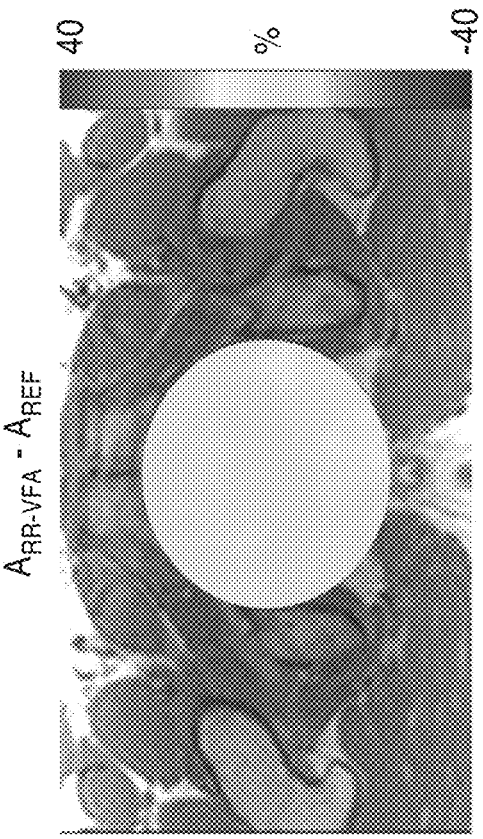
Figure 13C:
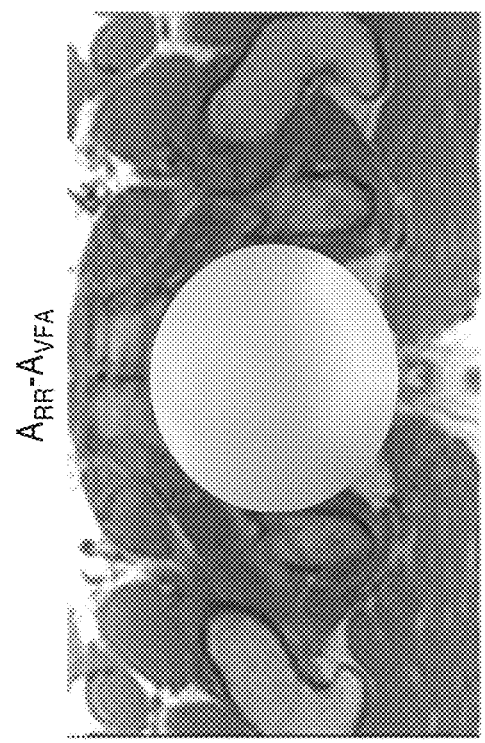
Figure 13D:
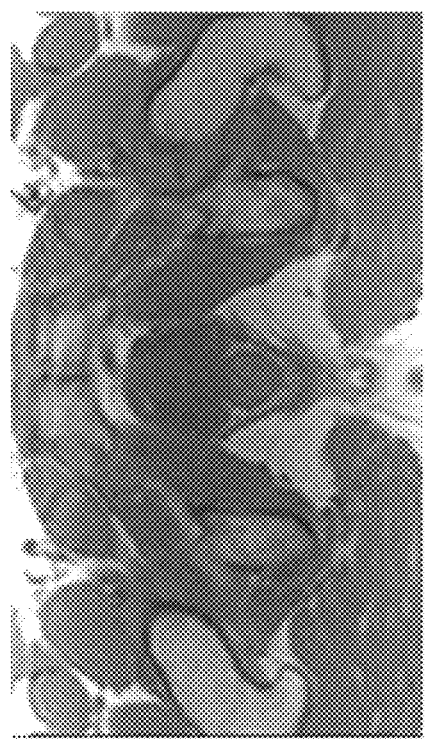

FIG. 13A shows an image detailing $A_{RR-VFA}$ in the prostate and obturator internus muscle surrounding the prostate. FIG. 13B shows an image of $A_{REF}$. FIGS. 13C and 13D show the T1-weighted MRI and as an anatomical reference and the difference between the two maps ($A_{RR-VFA} - A_{REF}$), respectively.

Figure 14A:
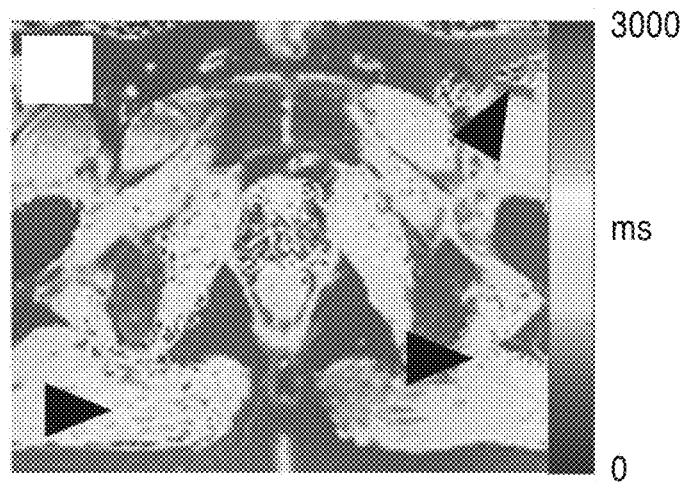
Figure 14B:
Figure 14C:
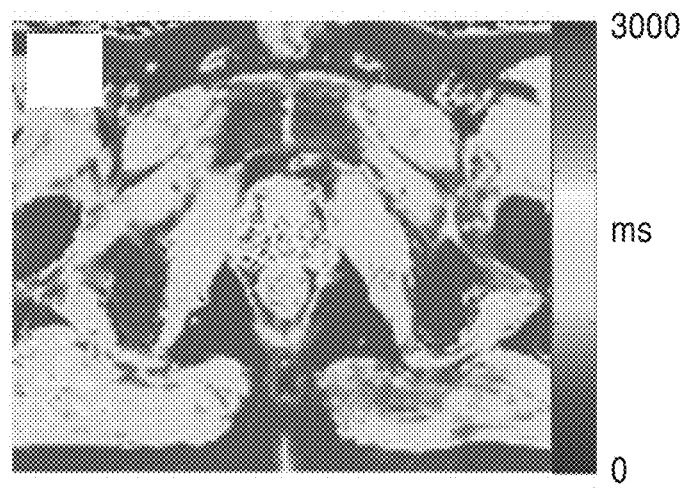

FIG. 14A through FIG. 14C show $T_1$ maps before and after $B_1^+$ correction in the prostate of the volunteer. FIG. 14A shows the mean prostate $T_1$ before $B_1^+$ correction ($T_{1non}$). FIG. 14B shows B1-corrected $T_1$ maps using RR-VFA ($T_{1RR-VFA}$). FIG. 14C shows the manufacturer-provided sequence ($T_{1REF}$).

Figure 15:
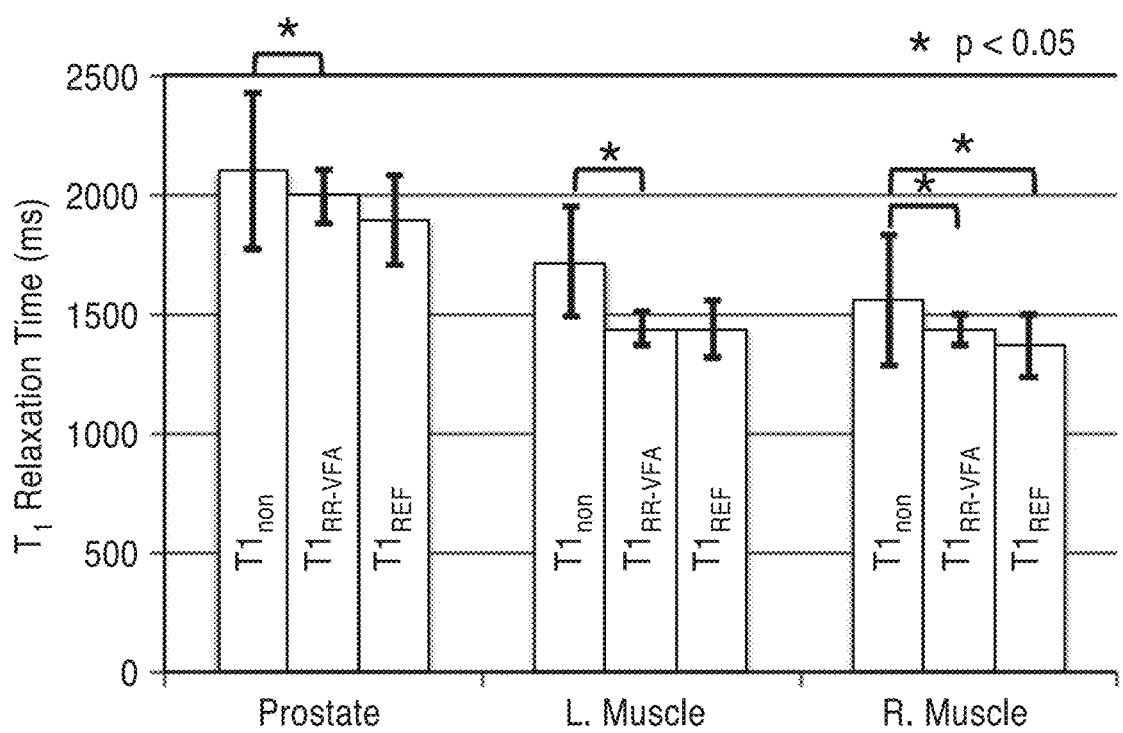

FIG. 15 a graph of the mean and standard deviations of $T_1$ in the prostate and the left and right obturator internus muscles.

Figure 16:
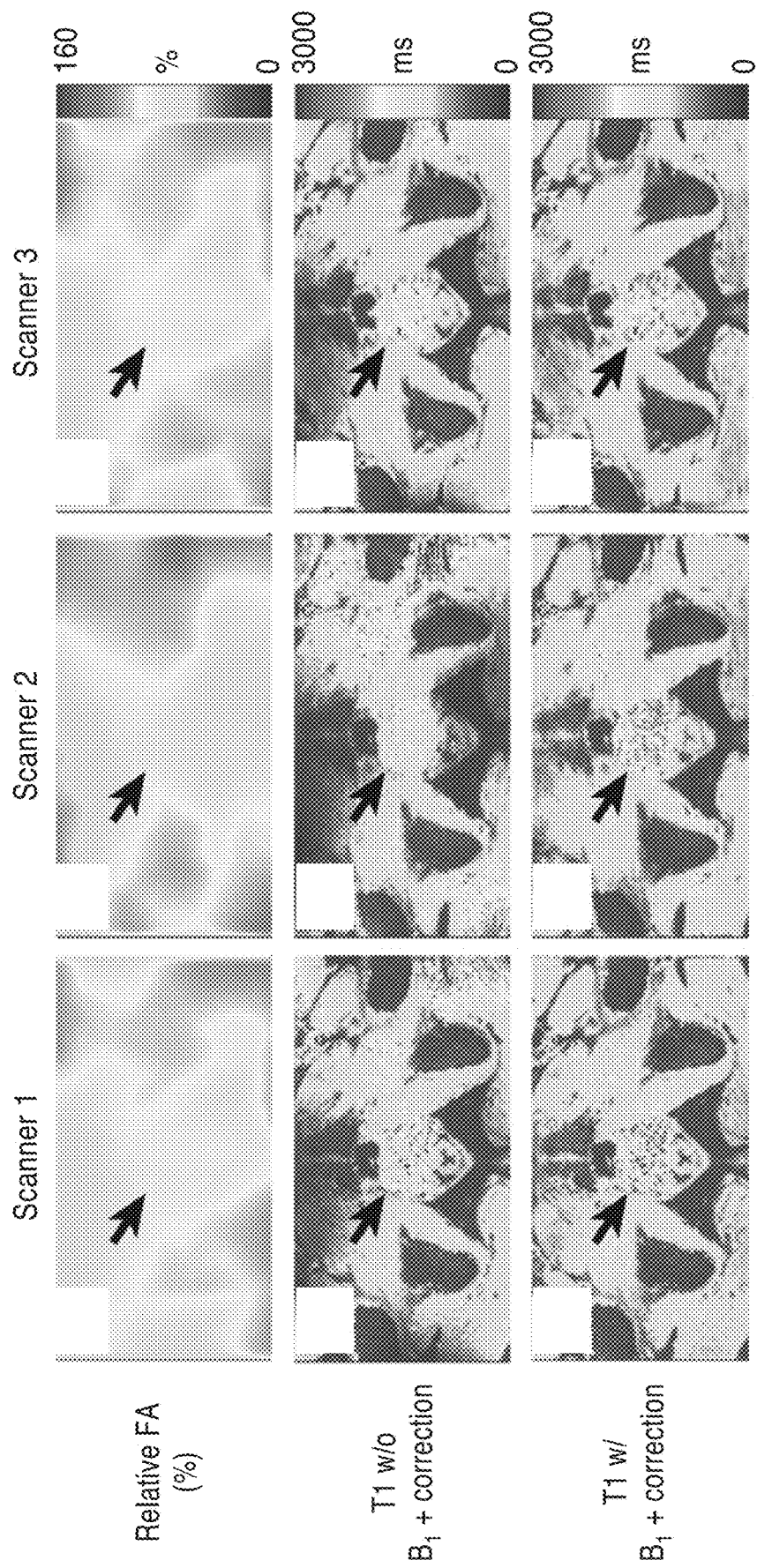
Figure 17:
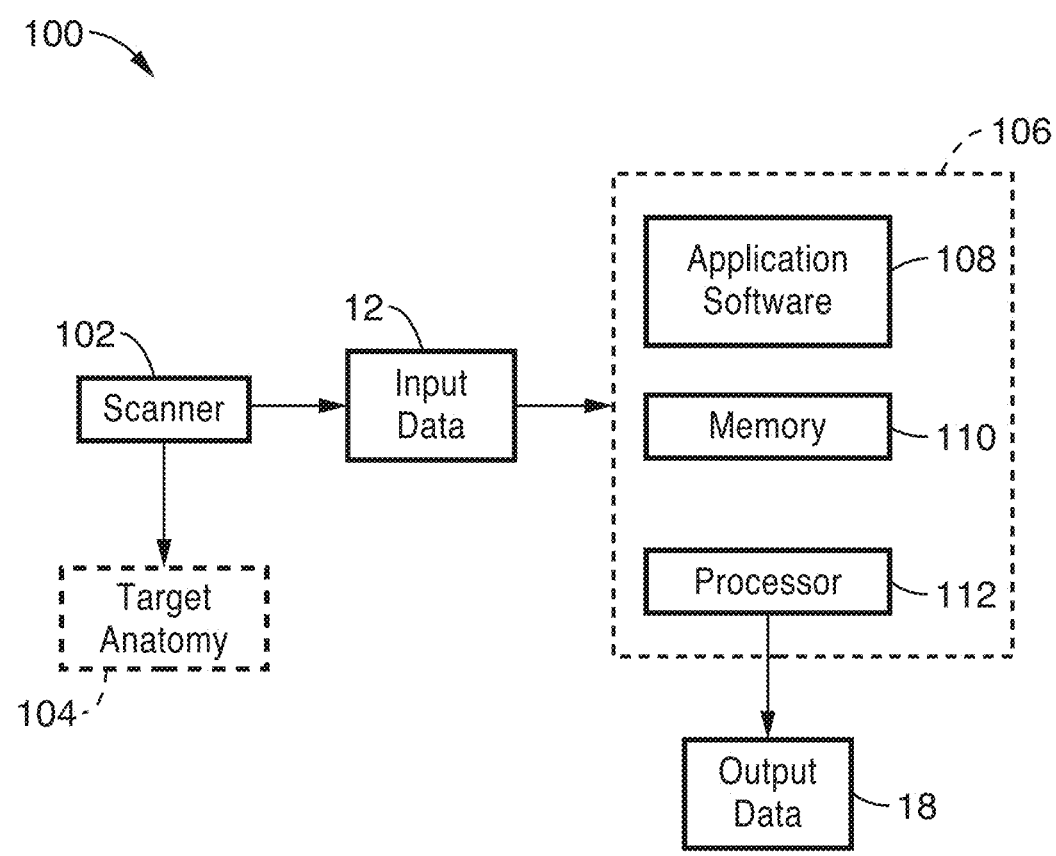

FIG. 16 shows a series of images illustrating a representative example of relative fat (rFA) and $T_1$ maps on three different scanners FIG. 17 illustrates an exemplary system for performing parametric mapping in accordance with the present description.

DETAILED DESCRIPTION

I. System Overview

FIG. 1 shows a schematic flow diagram of a parametric mapping method 10 in accordance with the present description. Method 10 utilizes a reference tissue region that is well-defined (e.g., fat) with a consistent characteristic parameter (e.g., $T_1$ relaxation time measurable using MRI) to characterize an unknown variable/parameter related to the system (e.g., $B_1^+$ inhomogeneity in MRI) through the use of a model of the system (e.g., an equation expressing MRI signal in fat as a function of imaging parameters, $T_1$ of fat, and a $B_1^+$ inhomogeneity-related parameter). This simultaneous 3D $T_1$ and $B_1^+$ VFA mapping technique is herein referred to as Reference Region Variable Flip Angle imaging (RR-VFA), and is shown in system characterization step 14. Once the unknown parameter within the reference region is calculated, it is interpolated at step 16 over the entire field of view (FOV) or image volume, or at least over a region that includes a target region within the FOV that is adjacent or in proximity to the reference region. The interpolation step 16 may be anatomically specific to a target region to optimize the reference region technique for a given application (e.g., prostate MRI) by calibrating the reference region characterization against a map of the unknown variable acquired using other means (e.g., another $B_1^+$ inhomogeneity map) to generate output data 18.

Figure 3A:
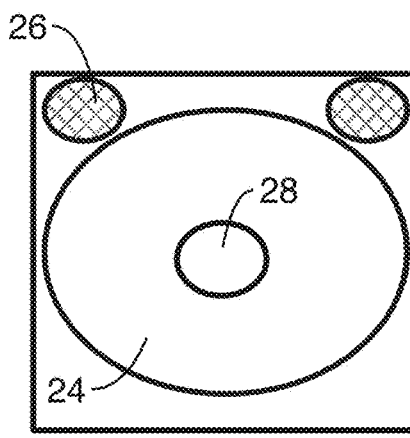
FIG. 3A is a diagram of a simplified image of target anatomy including an internal reference region and externally added reference region.
Figure 3B:
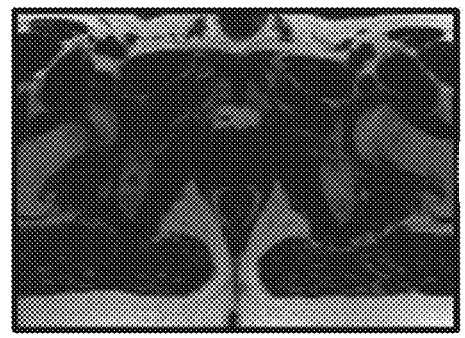
FIG. 3B is an exemplary image of input data with respect to a prostate region of a patient.

One specific implementation of method 10 is for imaging the prostate of a patient, and specifically calculation of pixel-based $B_1^+$ inhomogeneity maps in prostate MRI. Referring to FIG. 1, MR images of the prostate are acquired at step 12 using a standard clinical protocol (e.g. three-dimensional gradient echo with several low flip angles) and data (e.g. the image volume) is input with an internal or externally added reference region having a characteristic that is known or easily estimated. In the simplified diagram shown in FIG. 3A, an image of target anatomy or tissue 28 (e.g. prostate or like target tissue or anatomy that may not have well-resolved or characterized tissue regions) may include an internal reference region 24 or externally added reference region 26 within the field of view (FOV) of the image, i.e. image volume, with the reference regions 24/26 being well resolved in the image and adjacent or within the vicinity of the target region 28. An image of actual input data of an exemplary prostate region is shown in FIG. 3B.

In this implementation, fat is chosen as a reference tissue region, since it has a uniform and well-defined characteristic T1 relaxation time measurable using MRI. The MRI signal in fat tissue surrounding the prostate can be expressed as a function of imaging parameters: effective fat $T_1$, and a $B_1^+$ inhomogeneity-related parameter called relative flip angle (rFA). However, the accuracy of rFA calculated from the equation depends on effective selection of the reference region, i.e., (a) accurate selection of fat tissue using two parameters developed specifically for this purpose, fat signal segmentation factor (i.e. fractional segmentation constant), $t_F$, and signal fat fraction threshold, $r_F$, and (b) effective fat $T_1$, (i.e. $T_{1f}$). To choose the most effective values for these parameters in the prostate, a difference metric was developed to compare the rFA map obtained using a combination of $r_F$, $t_F$, and $T_{1f}$ with another rFA map that was acquired as a reference using a protocol available on all scanners from this manufacturer (manufacturer-provided protocol). Further, an error metric was developed using the manufacturer-provided protocol to assess the interpolation accuracy within the prostate.

In one embodiment, the $B_1^+$ maps are calculated using a standard clinical VFA imaging protocol, acquired using a spoiled gradient-echo (SPGR) sequence with two echo times, followed by Dixon separation of fat and water signal, denoted as $S_F$ and $S_W$. A position-dependent measure of the $B_1^+$ inhomogeneity, $A(\vec{\mu})$, is defined, and expressed in a percentage unit as relative flip angle (ratio of actual flip angle to prescribed flip angle). A ratio of steady-state SPGR signal magnitude for two prescribed flip angles, $\alpha_1$ and $\alpha_2$, can be expressed as:

$$\frac{S_{f\alpha_1}(\vec{\mu})}{S_{f\alpha_2}(\vec{\mu})} = \frac{\sin(A(\vec{\mu})\alpha_1)}{\sin(A(\vec{\mu})\alpha_2)} \cdot \frac{\left(1 - e^{-\frac{TR}{T_1}}\cos(A(\vec{\mu})\alpha_2)\right)}{\left(1 - e^{-\frac{TR}{T_2}}\cos(A(\vec{\mu})\alpha_1)\right)}, \quad \text{Eq. 1}$$

where TR is the repetition time, and $\vec{\mu}$ is a position vector denoting the pixel coordinates. $A(\vec{\mu})$ can be numerically computed using a theoretical value of the signal ratio as a function of $A(\vec{\mu})$, with knowledge of fat $T_1$, $T_{1f}$, and $A(\vec{\mu})$ can then be spatially interpolated across the tissue of interest, including the prostate.

Figure 2:
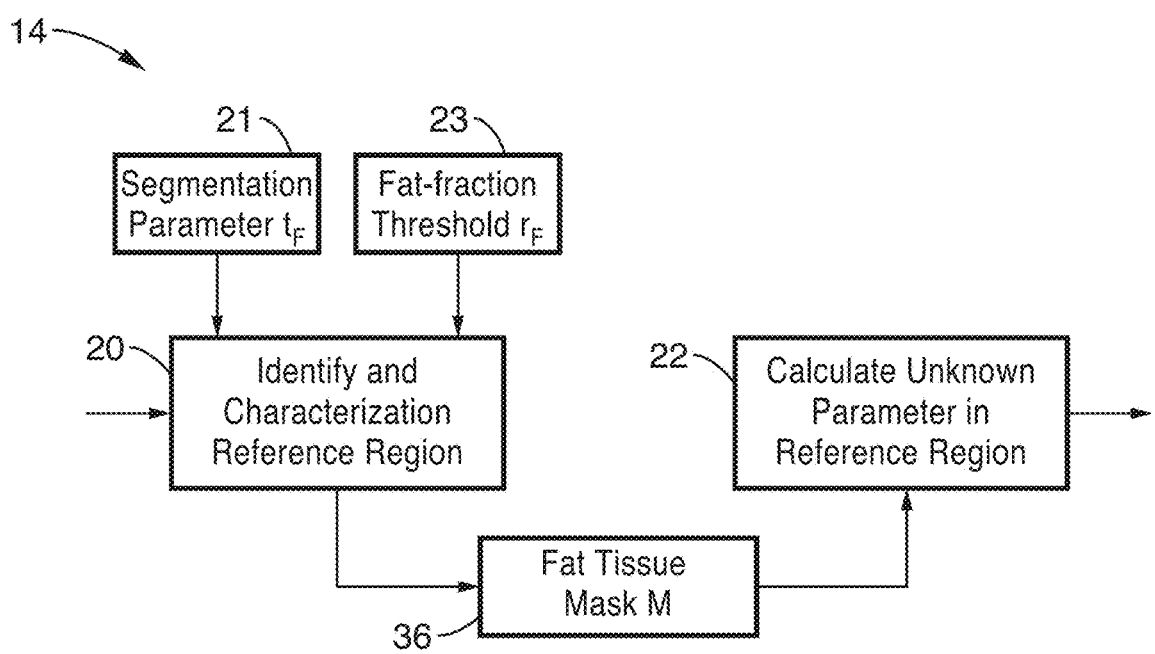
FIG. 2 is shows a schematic flow diagram of the reference region characterization step of FIG. 1.
Figure 4:
FIG. 4 shows an exemplary image of a fat tissue mask in accordance with the present description.
Figure 5:
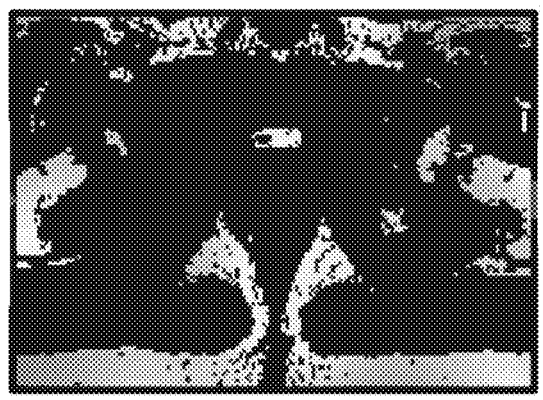
FIG. 5 shows an exemplary image of estimating rFA in fat tissue in accordance with the present description.
Figure 6:
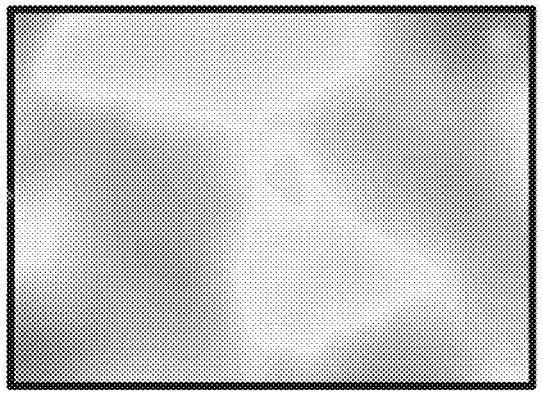
FIG. 6 shows an exemplary image illustrating interpolation of rFA over the prostate.
Figure 7:
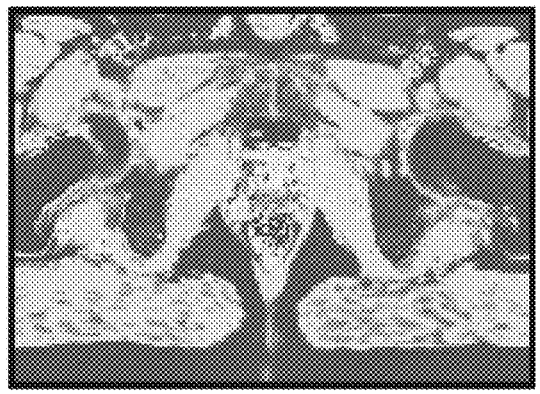
FIG. 7 shows an exemplary image of the optimized RR-VFA output.

Referring to FIG. 2, $B_1^+$ mapping of the prostate using RR-VFA first involves the step of identifying and characterizing the reference region 24/26 at step 20, e.g. for fat tissue ($T_{1f}$), and in particular, identifying fat tissue adjacent, around, or in the vicinity of the target prostate tissue 28 as the reference tissue 24/26 via a "fat tissue mask" (M) 36. An exemplary image of fat tissue mask (M) 36 is shown in FIG. 4. Next, the unknown parameter in the reference region is calculated in step 22 (e.g. estimating rFA in fat tissue, i.e. "rFA calculation," $A=f(r_F, t_F, T_{1f})$), an exemplary image of which is shown in FIG. 5. The data from step 22 is then further processed/optimized by interpolating rFA over the entire FOV or image volume of the image, or at least over a portion of the image that includes the reference region 24/26 and the target region 28 containing the prostate ("Interpolation" step 16 in FIG. 1). An exemplary image of interpolation step 16 is shown in FIG. 6. An exemplary image of the optimized RR-VFA output is shown in FIG. 7.

Accurate quantification of rFA using RR-VFA is a function of the selectivity and sparsity of the fat tissue, as it affects not only rFA calculation surrounding the prostate but also spatial interpolation accuracy within the prostate. For example, a highly fat-specific mask (i.e., high selectivity and sparsity) includes pixels with contributions from fat only, resulting in the accurate estimation of rFA, but can reduce the spatial interpolation accuracy within the prostate. On the contrary, a less fat-specific mask (i.e., low selectivity and sparsity) may include pixels with contributions from both fat and water, affecting the calculation of rFA, but can minimize the interpolation errors within the prostate. The following sub-sections will explain our optimization of RR-VFA $B_1^+$ mapping in the prostate by evaluating the appropriate identification and characterization of fat tissue around the prostate, and the spatial interpolation accuracy within the prostate.

A. Identification and Characterization of Fat Region

To accurately select and characterize fat tissue surrounding the prostate (step 20, FIG. 2), a combination of a user-selectable parameter for fat signal segmentation 21 and a signal fat-fraction threshold 23 is used to build an optimal binary fat tissue mask M 36 (0 as a non-fatty region and 1 as a fatty region). While fat is a preferred reference region 24/26 or tissue selected for the present application within the prostate, it is appreciated that other tissues may be selected that are well resolved and having a characteristic or characteristics that are known or readily estimated.

FIG. 8 shows a more detailed method 30 for generating output data 18 (FIG. 1). A user-selectable fractional constant, $t_F$, is added to the standard Otsu's method (Otsu N., A Threshold Selection Method from Gray-Level Histograms, Syst. Man Cybern., IEEE Trans. 1979; 9:62-66, incorporated by reference in its entirety) to improve fat tissue selection in the presence of relatively large intensity variations in fat signal due to different receiver coil geometries. To further mitigate rFA estimation errors arising from regions with compromised SNR and partial volume effects, an additional thresholding is added, a signal fat-fraction threshold $r_F$ (expressed as a percentage). The fat tissue mask M 36 is determined by applying a thresholding value, $t_F$ multiplied by $\eta_F$, (generated by Otsu's method), intersected with another thresholding by $r_F$, described as Eq. 2:

$$M(\vec{\mu}, t_F, r_F) = \left\{ \begin{array}{l} 1, \\ 0, \end{array} \left[ \frac{\frac{1}{N}\sum_{N=1}^{N} S_{Fa_n}(\vec{\mu})}{\max\left(\frac{1}{N}\sum_{N=1}^{N} S_{Fa_n}(\vec{\mu})\right)} > t_F \cdot \eta F \right] \cap \right.$$

$$\left[ \frac{S_{Fa_N}(\vec{\mu})}{S_{Fa_N}(\vec{\mu}) + S_{Wa_N}(\vec{\mu})} \times 100\% > r_F \right]$$

where $$S_{Wa_N} \text{ and } S_{Fa_N}$$

denote the Dixon-separated fat and water images for the highest ($N^{th}$) flip angle within $$S_{Wa_1}$$

to $$S_{Wa_N}$$

images 32 and $$S_{Fa_1}$$

to $$S_{Fa_N}$$

images 34, respectively. Increasing $t_F$ and $r_F$ reduces errors at the fat-water boundaries and low fat-signal regions, thus improving accuracy, but also increases spatial interpolation errors within the prostate.

Once mask M (36) is determined, rFA (38) may be characterized within the fat tissue, and $A_{FAT}$ (40), can be calculated (see calculation of unknown parameter step 22 in FIG. 2) or expressed as:

$$A_{FAT}(\vec{\mu}) = \left\{ \begin{array}{ll} A(\vec{\mu}, t_{1f}), & \vec{\mu} \in \{M(\vec{\mu}, t_F, r_F) = 1\} \\ 0, & \text{elsewhere} \end{array} \right., \quad \text{Eq. 3}$$

where $T_{1f}$ is an effective fat T1 value that is assumed to be well characterized prior to RR-VFA. In the presence of $B_0$ field inhomogeneity, partial volume effects at fat-water boundaries and other system imperfections, $T_{1f}$ values may be measured differently by various T1 mapping sequences. A population-based effective $T_{1f}$ was optimized by investigating various $T_{1f}$ data in the range of 290 ms to 360 ms.

Referring to interpolation step 16 (FIG. 1, FIG. 8), the combination of $t_F$, $r_F$ and $T_{1f}$ was optimized by minimizing the number of outliers, where the outliers were defined to include an extreme bias in the $A_{FAT}$ calculation, in comparison with a reference $B_1^+$ mapping scan, $A_{REF}$. This is based on the observation that a less fat-specific mask may include pixels that are not appropriate for Eq. 1, which could result in significant errors in $A_{FAT}$. A Bland-Altman plot of $A_{FAT}$ and $A_{REF}$ was used to compute a mean difference between two and a 95% confidence interval (CI) for each combination. $T_{1f}$ was firstly selected by minimizing the mean difference between two. Both $t_F$ and $r_F$ were determined by minimizing the number of pixels beyond CI, defined by a binary mask $\Delta_d$:

$$\Delta_d(\vec{\mu}) = \left\{ \begin{array}{ll} 1, & |A_{FAT}(\vec{\mu}) - A_{REF}(\vec{\mu})| > CI \\ 0, & \text{otherwise} \end{array} \right., \vec{\mu} \in \{M(\vec{\mu}, t_F, r_F) = 1\}. \quad \text{Eq. 4}$$

A fractional volume of outliers, δ, is computed by the number of outliers normalized by the number of fat pixels in a central volume (Vc) and was recorded as a function of $t_F$ (0.3-0.6), $r_F$ (50-98%), and $T_{1f}$ (290 ms-360 ms) for ten volunteers.

FIG. 9A through FIG. 9H illustrate the steps to calculate the fractional volume of outliers, δ used in the interpolation step 16 of FIG. 1 and FIG. 8). The first row (FIG. 9A through FIG. 9D) shows Dixon-separated fat and water images, $S_{F15}$ (FIG. 9A) and $S_{W15}$ (FIG. 9B), signal fat fraction map (FIG. 9C), and $A_{REF}$ (FIG. 9D). The central volume, $V_C$, center of the FOV in FIG. 9A through FIG. 9D, is shown in the second row (FIG. 9E through FIG. 9H). With the values of $r_F$=90% and $t_F$=0.5, the fat tissue mask M was created (FIG. 9E), and rFA within the fat tissue, $A_{FAT}$, was computed using $T_{1f}$=320 ms (FIG. 9F), in comparison with a reference $B_1^+$ map, $M \cdot A_{REF}$ (FIG. 9G). The absolute difference between the two $|A_{FAT} - M \cdot A_{REF}|$ (beyond the 95% confidence interval is shown in FIG. 9H (δ=4.78%).

II. Experiment/Evaluation

A. Evaluation of Interpolation Accuracy

The prostate typically contains no fat, and accurate interpolation is necessary to ensure accurate $B_1^+$ mapping using RR-VFA in the prostate. Since $B_1^+$ inhomogeneity varies smoothly over the volume at 3T, three-dimensional linear interpolation (step 16, FIG. 1 and FIG. 8) to estimate rFA in the prostate (i.e. to yield the rFA map over the entire FOV, $A_{RR-VFA}$ 44. The accuracy of interpolation was evaluated using $A_{REF}$, independent of RR-VFA, by applying the identical interpolation to the masked data, $M \cdot A_{REF}$. The post-interpolated rFA map, $A_{interp}$, was compared with $A_{REF}$ (pre-interpolated rFA).

The interpolation error, ε, was defined as the mean of the absolute difference between pre- and post-interpolated rFA within prostate, as follows:

$$\varepsilon = \frac{1}{N_{pros}} \sum_{\vec{\mu} \in M_{pros}} |A_{REF}(\vec{\mu}) - A_{interp}(\vec{\mu}, t_F, r_F)|, \quad \text{Eq. 5}$$

where $M_{pros}$ is the volumetric prostate region of interest (ROI) comprising the entire prostate, and $N_{pros}$ is M the number of pixels within $M_{pros}$. The interpolation error ε was calculated over ten volunteers and expressed using the previously defined range of $t_F$ (0.3-0.6) and $r_F$ (50-98%).

B. Experimental Configuration

All experiments were performed on three Siemens 3T scanners (Skyra ("Scanner 1"), Trio ("Scanner 2"), and Prisma ("Scanner 3"), Erlangen, Germany), using the body coil for RF transmission and receive-only phased-array coil for signal reception. RF transmission modes differed between scanners: Scanners 1 and 3 were operated with "TrueForm" RF transmission and Scanner 2 was operated with circular polarization. All experiments were performed with the volunteers positioned supine and feet first. Our study was approved by the local institutional review board, and informed written consent was obtained from all volunteers prior to the scans.

For single-scanner evaluation, ten healthy male volunteers (30±3.6 years, 73±9 kgs) were scanned on Scanner 1. Images were acquired using the standard clinical VFA imaging protocol at our institution, where the VFA images were acquired using three-dimensional FLASH acquisition with a dual-echo bipolar readout followed by Dixon separation of $S_F$ and $S_W$. The 3T VFA protocol with Dixon separation does not increase scan time and is available commercially on most 3T MRI scanners. The two echo times were $TE_1/TE_2$=1.23/2.46 ms to acquire opposed-phase and in-phase images, respectively, and fat- and water-only images were calculated at the scanner using a method based on the two-point Dixon fat-water separation algorithm. This FLASH sequence was repeated with the following four flip angles (FA): 2°, 5°, 10°, and 15°. Other imaging parameters common to all protocols were: TR=4.17 ms, FOV=26 cm, partition thickness/spacing=3.6/0.7 mm, 20 partitions, acquisition matrix=160×160, averages=3/2/2/2 and scan duration=52/35/35/35 s for FA=2°/5°/10°/15° respectively, for each acquisition.

Reference $B_1^+$ maps ($A_{REF}$) were acquired for comparison using the ratio of images obtained from a combination of spin and stimulated echo excitation. This $B_1^+$ mapping sequence was the only available option on all three scanners as manufacturer's service $B_1^+$ measurement and was implemented as a two-dimensional multi-slice acquisition with echo-planar imaging readout for improved time-efficiency (27,28). The other imaging parameters were TR=500 ms, TE=14 ms, FOV=26 cm, slice thickness/spacing=8/16 mm, 7 slices, acquisition matrix=128, scan duration ~40 s.

For multi-scanner evaluation, a subset of four volunteers from the Scanner 1 cohort (29±3.1 years, 74.5±10.4 kgs) was also scanned on Scanners 2 and 3 using the same VFA protocol mentioned above to compare $B_1^+$ and $T_1$ maps across scanners.

C. Data Analysis

RR-VFA was implemented in MATLAB (The Mathworks, Natick, Mass., USA), where rFA maps were calculated from the VFA images using $t_F$ of 0.5, $r_F$ of 90%, and $T_{1f}$ of 320 ms from the results of the analysis. The rFA maps obtained in the pixels representing fat tissue were smoothed across the imaging volume using a 5×5×5 boxcar function prior to interpolation. $T_1$ maps were generated from the VFA images before and after applying RR-VFA $B_1^+$ correction. RR-VFA was implemented using all four flip angles by calculating rFA using two sets of two FAs each (2°, 10° and 5°, 15°) in M and calculating rFA as the mean of the two values.

Three ROIs were chosen for analysis, including the volumetric prostate ROI and two ROIs manually selected in the obturator internus muscles left and right of the prostate. These latter muscle ROIs were chosen to check the consistency by comparing rFA and $T_1$ values on contra lateral sides. Mean and standard deviations were calculated within the ROIs, and $T_1$ values over 4000 ms were excluded in the calculation to avoid bias due to outliers. For the corrected $T_1$ maps, the corresponding pixels in the rFA maps were also excluded from calculations. Typically, over 99.5% of the total sample size of the volumetric ROI of the prostate was retained after this step. No pixels in the muscle ROIs were excluded. Statistical f-tests were performed (level of significance set top <0.05) on the mean values to compare $T_1$ values in the prostate and muscle ROIs before and after applying $B_1^+$ correction.

III. Experimental Results

A. RR-VFA Optimization in the Prostate

A fractional volume of outliers, δ, was computed (according to the steps detailed in FIG. 9A through FIG. 9H) by the number of outliers normalized by the number of fat pixels in a central volume (Vc) and was recorded as a function of $t_F$ (0.3-0.6), $r_F$ (50-98%), and $T_{1f}$ (290-360 ms) for ten volunteers.

FIG. 10A through FIG. 10C are plots illustrating the variation between the two maps as a function of $t_F$, $r_F$ and $T_{1f}$. FIG. 10A shows the mean difference of rFA varying with $T_{1f}$ and $r_F$, and a constant $t_F$=0.5. FIG. 10B shows the mean difference of rFA as a function of $T_{1f}$ and $t_F$, and $r_F$ constant at 90%. From these two plots, we can infer that for each $t_F$ and $r_F$, the mean rFA difference is generally least for $T_{1f}$=320 ms at under 5%. From FIG. 10A and FIG. 10B, the optimal $T_{1f}$ can be determined as 320 ms, with 2% or less rFA variation in the $T_{1f}$ range of 300-330 ms. FIG. 10C shows the dependence of the fractional volume, δ, on a combination of $t_F$ and $r_F$ when $T_{1f}$=320 ms. At this optimal $T_{1f}$, δ shows a gradual decrease as $t_F$ and $r_F$ increase. It is evident that, for $r_F$≤80%, δ varies with $t_F$ but less so with $r_F$, indicating that $t_F$ is the dominant factor in this range of $r_F$. In general, δ decreases as $r_F$ increases beyond 80%.

The evaluation of the interpolation accuracy (interpolation error metric, ε) is shown in FIG. 11A through FIG. 11F. With $S_{F15}$ and $S_{W15}$ of FIG. 11A and FIG. 11B, respectfully, FIG. 11C shows a central region of $A_{REF}$ for one volunteer. The prostate ROI, $M_{pros}$, is outlined in black in FIG. 11C, and $V_C$ is outlined in white (FIG. 11A and FIG. 11B). The fat tissue mask M, (FIG. 11D) was created using $t_F$=0.5 and $r_F$=90%, and was used to generate the masked data M·$A_{REF}$ (FIG. 11E). The masked rFA map, M·$A_{REF}$, was used to apply the three-dimensional linear interpolation and generate the absolute difference image |$A_{REF}$–$A_{interp}$|·$M_{pros}$ (FIG. 11F) to calculate the interpolation error ε.

FIG. 12A through FIG. 12D are plots illustrating the effects of $t_F$ and $r_F$ when appropriately identifying the fat reference region. The fractional volume δ and the interpolation error ε are shown in FIG. 12A and FIG. 12B respectively, illustrating generally opposing effects with various combinations of $t_F$ and $r_F$. FIG. 12C and FIG. 12D show two cross-section plots when $r_F$=90% (FIG. 12C) and $t_F$=0.5 (FIG. 12D) with $T_{1f}$=320 ms, corresponding to the horizontal and vertical dotted lines. Although ε shows an increasing trend, it is generally at or below 3.5% for $r_F$≤95% and $t_F$≤0.55, and an effective value of $t_F$ could be chosen between 0.4 and 0.55 ($t_F$=0.5 selected empirically in this study). With $t_F$=0.5, δ decreases when $r_F$≥80%, and a suitable value of $r_F$ could be chosen between 80% and 95% ($r_F$=90% selected empirically in this study).

B. RR-VFA Evaluation: Single-Scanner

FIG. 13A through FIG. 13C are images showing an example from a single volunteer. The image of FIG. 13A, detailing $A_{RR-VFA}$ in the prostate and obturator internus muscle surrounding the prostate, was visually very similar to $A_{REF}$ (FIG. 13B). FIGS. 13C and 13D show the T1-weighted MRI and as an anatomical reference and the difference between the two maps ($A_{RR-VFA}$–$A_{REF}$), respectively. In the prostate ROI, the mean $A_{RR-VFA}$ was 102.6% and the mean $A_{REF}$ was 105.4% in the volunteer group (n=10), with no significant differences between the two $B_1^+$ mapping techniques. $A_{RR-VFA}$ shows that rFA ranged from 90% to 122% in the prostate ROI for different volunteers, highlighting the need to correct for $B_1^+$ inhomogeneity. In addition, $A_{RR-VFA}$ was systematically higher by approximately 7% in the left obturator internus muscle (108.9%) over the right obturator internus muscle (102.2%), summarized in Table 1. Table 1 provides a summary of the results of applying RR-VFA on images from ten healthy volunteers on a single scanner. Mean and standard deviations (upper line in each row) are accompanied by ranges (minimum through maximum values).

FIG. 14A through FIG. 14C are $T_1$ maps before and after $B_1^+$ correction in the prostate of the volunteer. FIG. 14A shows the mean prostate $T_1$ before $B_1^+$ correction ($T_{1non}$), which was 2112±333 ms (range: 1560-2615 ms, coefficient of variation (CoV): 15.8%). FIG. 14B shows B1-corrected $T_1$ maps using RR-VFA ($T_{1RR-VFA}$). FIG. 14C shows the manufacturer-provided sequence ($T_{1REF}$). FIG. 15 shows a graph of the mean and standard deviations of $T_1$ in the prostate and the left and right obturator internus muscles.

In FIG. 14A, and several areas of non-uniform $T_1$ values are apparent, especially in the left and right obturator internus muscles, with mean $T_1$ of 1722±229 ms and 1557±275 ms, respectively (FIG. 14A, FIG. 15 and Table 1). After $B_1^+$ correction, mean prostate $T_1$($T_{1RR-VFA}$) was 1998±113 ms (range: 1812-2159 ms, CoV: 5.7%), and $T_{1REF}$ was 1900±190 (range: 1480-2107 ms, CoV: 10%). Note that $T_{1RR-VFA}$ has significantly lower standard deviation than $T_{1non}$(p=0.004). The left and right muscle $T_1$ values were very consistent with each other after $B_1^+$ correction (Table 1). As in the prostate, the muscle $T_1$ showed a tighter distribution (p<0.01) after $B_1^+$ correction using RR-VFA.

C. RR-VFA Evaluation: Multi-Scanner

FIG. 16 shows a series of images illustrating a representative example of relative fat (rFA) and $T_1$ maps on three different scanners (Scanner 1 in the left column, Scanner 2 in the middle column, and Scanner 3 in the right column). The rFA maps in the top row show differences in the central region comprising the prostate (indicated with black arrow). The $T_1$ maps without $B_1^+$ correction (middle row, $T_{1non}$) show $T_1$ differences in the prostate, indicated by the arrows. The $T_1$ maps with $B_1^+$ correction (bottom row, $T_{1RR-VFA}$) indicate improved agreement in the three scanners within the prostate.

Table 2A and Table 2B show a summary of the results of RR-VFA applied in four healthy volunteers on three different MRI scanners. The first four lines show mean $A_{RR-VFA}$ in the prostate ROI per volunteer and per scanner, and $T_{1non}$ and the resulting $T_{1RR-VFA}$. The bottom line shows the mean prostate $A_{RR-VFA}$ in the group of four volunteers. Table 2A and Table 2B demonstrate reduced range of $T_{1RR-VFA}$ compared with $T_{1non}$, within each scanner and across scanners, with a large range of $T_{1non}$ values for different volunteers and scanners (1760±278 ms, range: 1260 ms to 2119 ms) and with a lower range of $T_{1RR-VFA}$ (1921±131 ms, range: 1646-2072 ms). The individual volunteers show that CoV in $T_{1non}$ reduced from 6-28% to 1-12% in $T_{1RR-VFA}$.

III. System Hardware Configuration

FIG. 17 illustrates an exemplary system 100 for performing parametric mapping in accordance with the present description. Input data 12 of target anatomy 104 (e.g. prostate region) is obtained via scanner 102 (e.g. MRI scanner or the like) and input into computing device 106 (e.g. computer, server, or the like). Application software 106 is stored in memory 110, and includes instructions executable on processor 112 for applying methods 10, 30 (FIG. 1 and FIG. 8 respectively).

IV. Discussion/Conclusions

An objective of the present description is an optimized RR-VFA method to simultaneously map $T_1$ and $B_1^+$ values in the prostate. Three parameters: a fractional signal segmentation constant, $t_F$, a signal fat-fraction threshold, $r_F$, and a population-based effective fat $T_1$, $T_{1f}$, were selected as 0.5, 90% and 320 ms, respectively, by comparing $A_{RR-VFA}$ with $A_{REF}$. With these parameters, the interpolation error was within 3.5% in the prostate. On a single scanner, results showed various $A_{RR-VFA}$ in the prostate (with a range of 30%) and a significantly reduced range of $T_1$ values after $B_1^+$ correction using RR-VFA. The multi-scanner study showed up to 14% intra-volunteer inter-scanner differences in rFA, and improved consistency of $B_1^+$ corrected $T_1$ values across three MRI scanners. These results demonstrate not only the need for $B_1^+$ correction in the prostate, but also the effective characterization of the rFA in the prostate using RR-VFA without an additional acquisition for $B_1^+$ mapping.

The manufacturer-provided sequence used as a reference for the optimization was chosen due to its universal availability on all of our MRI scanners. This $B_1^+$ mapping sequence carries an rFA bias dependent on the prescribed flip angle, mixing time, and tissue $T_1$ assumption. As an example, in $B_1^+$ inhomogeneity mapping in the brain, a $T_1$ bias of 300 ms with a mixing time of 28 ms yielded 0.6% bias in rFA for flip angles in the range of 40°-140°. This bias is quite small to begin with. Further, the fractional volume, δ, developed to compare $A_{RR-VFA}$ with $A_{REF}$, was chosen to include the larger differences due to choices of $T_{1f}$ and $r_F$ in RR-VFA and exclude the smaller differences between the two methods that may have been due to the bias in the manufacturer-provided technique. Other $B_1^+$ mapping sequences can be used for similar comparisons with RR-VFA if their performance/bias characteristics can be accounted for.

The population-based effective $T_1$ within the fat tissue, $T_{1f}$, was characterized as 320 ms across a population of healthy volunteers. Previous studies have reported fat $T_1$ measurements of 367-382 ms in the pelvis and other anatomical regions at 3T. Although the inter-subject variability of $T_{1f}$ is small, these differences indicate that some heterogeneity in experimental set-up and analysis may cause a potential bias in the characterization of $T_{1f}$. In our study, we found mean rFA variations of less than 2% in the suggested $T_{1f}$ range of 300-330 ms. Additionally, the improved quality of $T_1$ maps in the pelvis and significantly reduced standard deviations of prostate and muscle $T_1$ after $B_1^+$ correction suggest a good characterization of $T_{1f}$.

The other parameters in the optimization step were $t_F$ and $r_F$, selected to facilitate accurate identification of fat reference regions surrounding the prostate. The optimized selectivity and sparsity of the fat tissue indicated a range of $r_F$ values between 80% and 95% and $t_F$ between 0.4 and 0.55. Within this range, we empirically selected $r_F$=90% and $t_F$=0.5 with the interpolation error <3.5%.The distribution of fat pixels is currently not a concern in the environment of the prostate but could be an important factor in effectively adapting RR-VFA to other anatomical areas. Future work may investigate an adaptive signal fat fraction threshold combined with a priori knowledge of the fat tissue distribution.

In the single-scanner evaluation, RR-VFA showed variations (max-min) of up to 30% in the average $A_{RR-VFA}$ in the prostate among volunteers. The difference between average $A_{REF}$ and $A_{RR-VFA}$ was within 3%, suggesting that RR-VFA is comparable with the manufacturer-provided $B_1^+$ mapping protocol. The corresponding prostate $T_{1non}$ showed a variation of 1055 ms (range: 1560-2615 ms) across 10 volunteers, decreasing to 347 ms (range: 1812-2159 ms) after $B_1^+$ correction using RR-VFA. In addition, we evaluated $T_1$ values in the obturator internus muscles adjoining the prostate to its left and right and showed improved consistency of the $B_1^+$ corrected $T_1$ values (within 5 ms of each other). These results demonstrate the effectiveness of RR-VFA for $B_1^+$ mapping and indicate its potential in reducing $T_1$ estimation errors.

In the multi-scanner evaluation, RR-VFA showed differences of up to 14% in $A_{RR-VFA}$ within a volunteer scanned on three scanners. This rFA difference corresponded to an average CoV of 14.5% in $T_{1non}$ estimated from different scanners for the same individual volunteers that reduced to an average CoV of 5.1% in $T_{1RR-VFA}$. The multi-scanner comparison thus demonstrates a decreased range of $T_{1RR-VFA}$ values (as shown in FIG. 8) on a per-volunteer basis and reflects the improved consistency and reproducibility of $T_1$ measurements after $B_1^+$ correction using the optimized RR-VFA in a multi-scanner setting.

In conclusion, the RR-VFA technique was optimized for simultaneous mapping of $B_1^+$ and $T_1$ in the prostate and performed evaluations in healthy volunteers within and across 3T MRI scanners. With the optimized parameters, relative flip angle characterized by RR-VFA showed differences of up to 30% across volunteers in the prostate on a single scanner, comparable to that from a manufacturer-provided $B_1^+$ mapping protocol without the need for an additional scan. Inter-scanner coefficient of variations of estimated $T_1$ for the same subject reduced from 15% to 5% after RR-VFA $B_1^+$ correction. The application of RR-VFA $B_1^+$ correction has the potential to greatly improve $T_1$ quantification consistency, resulting in improved quantitative DCE-MRI of the prostate.

Embodiments of the present technology may be described herein with reference to flowchart illustrations of methods and systems according to embodiments of the technology, and/or procedures, algorithms, steps, operations, formulae, or other computational depictions, which may also be implemented as computer program products. In this regard, each block or step of a flowchart, and combinations of blocks (and/or steps) in a flowchart, as well as any procedure, algorithm, step, operation, formula, or computational depiction can be implemented by various means, such as hardware, firmware, and/or software including one or more computer program instructions embodied in computer-readable program code. As will be appreciated, any such computer program instructions may be executed by one or more computer processors, including without limitation a general purpose computer or special purpose computer, or other programmable processing apparatus to produce a machine, such that the computer program instructions which execute on the computer processor(s) or other programmable processing apparatus create means for implementing the function(s) specified.

Accordingly, blocks of the flowcharts, and procedures, algorithms, steps, operations, formulae, or computational depictions described herein support combinations of means for performing the specified function(s), combinations of steps for performing the specified function(s), and computer program instructions, such as embodied in computer-readable program code logic means, for performing the specified function(s). It will also be understood that each block of the flowchart illustrations, as well as any procedures, algorithms, steps, operations, formulae, or computational depictions and combinations thereof described herein, can be implemented by special purpose hardware-based computer systems which perform the specified function(s) or step(s), or combinations of special purpose hardware and computer-readable program code.

Furthermore, these computer program instructions, such as embodied in computer-readable program code, may also be stored in one or more computer-readable memory or memory devices that can direct a computer processor or other programmable processing apparatus to function in a particular manner, such that the instructions stored in the computer-readable memory or memory devices produce an article of manufacture including instruction means which implement the function specified in the block(s) of the flowchart(s). The computer program instructions may also be executed by a computer processor or other programmable processing apparatus to cause a series of operational steps to be performed on the computer processor or other programmable processing apparatus to produce a computer-implemented process such that the instructions which execute on the computer processor or other programmable processing apparatus provide steps for implementing the functions specified in the block(s) of the flowchart(s), procedure (s) algorithm(s), step(s), operation(s), formula(e), or computational depiction(s).

It will further be appreciated that the terms "programming" or "program executable" as used herein refer to one or more instructions that can be executed by one or more computer processors to perform one or more functions as described herein. The instructions can be embodied in software, in firmware, or in a combination of software and firmware. The instructions can be stored local to the device in non-transitory media, or can be stored remotely such as on a server, or all or a portion of the instructions can be stored locally and remotely. Instructions stored remotely can be downloaded (pushed) to the device by user initiation, or automatically based on one or more factors.

It will further be appreciated that as used herein, that the terms processor, hardware processor, computer processor, central processing unit (CPU), and computer are used synonymously to denote a device capable of executing the instructions and communicating with input/output interfaces and/or peripheral devices, and that the terms processor, hardware processor, computer processor, CPU, and computer are intended to encompass single or multiple devices, single core and multicore devices, and variations thereof.

From the description herein, it will be appreciated that that the present disclosure encompasses multiple embodiments which include, but are not limited to, the following:

1. An apparatus for imaging a target tissue, comprising: (a) a processor; and (b) a non-transitory memory storing instructions executable by the processor; (c) wherein said instructions, when executed by the processor, perform steps comprising: (i) acquiring one or more images of the target tissue and surrounding target tissues; (ii) identifying and characterizing a reference tissue region within the one or more acquired images, the reference tissue region being adjacent or in proximity to the target tissue within a field of view of the one or more images, the reference tissue region being well-defined within the one or more images and having a consistent characteristic parameter that is known or readily estimated; (iii) calculating an unknown parameter within the reference region; (iv) interpolating the calculated unknown parameter of the reference region over the entire field of view of the one or more images; and (v) outputting image data of the one or more images, the image data comprising a parametric map of the target tissue.

2. The apparatus of any preceding embodiment, wherein the target tissue comprises a tissue having imaging characteristics that are not well-defined or having a consistent characteristic parameter that is known or readily estimated.

3. The apparatus of any preceding embodiment, wherein the reference tissue comprises a fat tissue in proximity to or at least partially surrounding the target tissue.

4. The apparatus of any preceding embodiment, wherein the target tissue comprises a prostate tissue having little or no fat tissue.

5. The apparatus of any preceding embodiment, wherein acquiring one or more images of the target tissue comprises performing quantitative dynamic contrast-enhanced magnetic resonance imaging (DCE-MRI) at 3T using three-dimensional RF-spoiled gradient echo images with variable flip angles (VFA) to generate the parametric map comprising $T_1$ measurements.

6. The apparatus of any preceding embodiment: wherein $T_1$ measurements are susceptible to $B_1^+$ field inhomogeneity comprising errors due to spatial variations in flip angle caused by transmit radiofrequency (RF) from the quantitative DCE-MRI; and wherein outputting image data comprises simultaneously mapping $T_1$ and $B_1^+$ field inhomogeneity values associated with the target tissue.

7. The apparatus of any preceding embodiment: wherein calculating the unknown parameter in the reference region comprises estimating $B_1^+$ field inhomogeneity in the fat tissue; and wherein interpolating the calculated unknown parameter of the reference region comprises interpolating the estimating $B_1^+$ inhomogeneity over at least a portion of the FOV of the one or more images, the portion comprising the target tissue.

8. The apparatus of any preceding embodiment, wherein the consistent characteristic parameter comprises an effective fat $T_1$ value associated with the reference region; and wherein the unknown parameter of the reference region comprises an rFA value associated with the reference region.

9. The apparatus of any preceding embodiment, wherein identifying and characterizing a reference tissue region comprises: applying a combination of a user-selectable parameter for fat signal segmentation and a signal fat-fraction threshold; and building a binary fat tissue mask of the reference tissue region.

10. The apparatus of any preceding embodiment, wherein Dixon-separated fat and water images are used to build the binary fat mask.

11. The apparatus of any preceding embodiment, wherein the binary fat mask is used to characterize an rFA value associated with the reference region; and wherein interpolating the calculated unknown parameter of the reference region comprises interpolating the rFA value at least a portion of the FOV of the one or more images, the portion comprising the target tissue.

12. The apparatus of any preceding embodiment, wherein the rFA value comprises $B_1^+$ field inhomogeneity.

13. The apparatus of any preceding embodiment, wherein interpolating the calculated unknown parameter of the reference region comprises computing a fractional volume of outliers comprising a combination of user-selectable parameter for fat signal segmentation, the signal fat-fraction threshold, and effective fat $T_1$ values.

14. A method for imaging a target tissue, comprising: acquiring one or more images of the target tissue and surrounding target tissues; identifying and characterizing a reference tissue region within the one or more acquired images, the reference tissue region being adjacent or in proximity to the target tissue within a field of view of the one or more images, the reference tissue region being well-defined within the one or more images and having a consistent characteristic parameter that is known or readily estimated; calculating an unknown parameter within the reference region; interpolating the calculated unknown parameter of the reference region over the entire field of view of the one or more images; and outputting image data of the one or more images, the image data comprising a parametric map of the target tissue.

15. The method of any preceding embodiment, wherein the target tissue comprises a tissue having imaging characteristics that are not well-defined or having a consistent characteristic parameter that is known or readily estimated.

16. The method of any preceding embodiment, wherein the reference tissue comprises a fat tissue in proximity to or at least partially surrounding the target tissue.

17. The method of any preceding embodiment, wherein the target tissue comprises a prostate tissue having little or no fat tissue.

18. The method of any preceding embodiment, wherein acquiring one or more images of the target tissue comprises performing quantitative dynamic contrast-enhanced magnetic resonance imaging (DCE-MRI) at 3T using three-dimensional RF-spoiled gradient echo images with variable flip angles (VFA) to generate the parametric map comprising $T_1$ measurements.

19. The method of any preceding embodiment, wherein $T_1$ measurements are susceptible to $B_1^+$ field inhomogeneity comprising errors due to spatial variations in flip angle caused by transmit radiofrequency (RF) from the quantitative DCE-MRI; and wherein outputting image data comprises simultaneously mapping $T_1$ and $B_1^+$ field inhomogeneity values associated with the target tissue.

20. The method of any preceding embodiment, wherein calculating the unknown parameter in the reference region comprises estimating $B_1^+$ field inhomogeneity in the fat tissue; and wherein interpolating the calculated unknown parameter of the reference region comprises interpolating the estimating $B_1^+$ inhomogeneity over at least a portion of the FOV of the one or more images, the portion comprising the target tissue.

21. The method of any preceding embodiment, wherein the consistent characteristic parameter comprises an effective fat $T_1$ value associated with the reference region; and wherein the unknown parameter of the reference region comprises an rFA value associated with the reference region.

22. The method of any preceding embodiment, wherein identifying and characterizing a reference tissue region comprises: applying a combination of a user-selectable parameter for fat signal segmentation and a signal fat-fraction threshold; and building a binary fat tissue mask of the reference tissue region.

23. The method of any preceding embodiment, wherein Dixon-separated fat and water images are used to build the binary fat mask.

24. The method of any preceding embodiment, wherein the binary fat mask is used to characterize an rFA value associated with the reference region; and wherein interpolating the calculated unknown parameter of the reference region comprises interpolating the rFA value at least a portion of the FOV of the one or more images, the portion comprising the target tissue.

25. The method of any preceding embodiment, wherein the rFA value comprises $B_1^+$ field inhomogeneity.

26. The method of any preceding embodiment, wherein interpolating the calculated unknown parameter of the reference region comprises computing a fractional volume of outliers comprising a combination of user-selectable parameter for fat signal segmentation, the signal fat-fraction threshold and effective fat $T_1$ values.

27. A method for magnetic resonance tissue imaging, the method comprising: (a) obtaining $T_1$ values of a reference region of a tissue at approximately 3T or higher; (b) mapping $B_1^+$ values of the reference region of tissue; (c) measuring $T_1$ and $B_1^+$ maps of a non-reference target region of a tissue simultaneously with Region Variable Flip Angle (RR-VFA) using; and (d) using measured $T_1$ and $B_1^+$ values with dynamic contrast-enhanced MRI (DCE-MRI) or Multi-parametric MRI (mp-MRI) to form an image of the target region of tissue.

28. The method of any preceding embodiment, further comprising: identifying reference tissue regions for $B_1^+$ mapping with a scheme selected from the group consisting of a two-point Dixon scheme, a manual segmentation scheme, or semi-manual segmentation scheme.

29. The method of any preceding embodiment, further comprising: acquiring a time series of $T_1$-weighted MRI scans of a target tissue before and after injection of a contrast agent.

30. A method for magnetic resonance imaging of prostate tissue, the method comprising: (a) measuring $T_1$ relaxation times of a reference region of a fat tissue surrounding the prostate of a subject with magnetic resonance imaging; (b) determining effective fat $T_1$ and relative flip angle (rFA) values from an MRI signal from the fat tissue; (c) simultaneously measuring $T_1$ and $B_1^+$ maps using reference region variable flip angle (RR-VFA) imaging; (d) acquiring magnetic resonance scans of the prostate with a standard clinical protocol of a three-dimensional gradient echo with several low flip angles; and (e) forming an image from magnetic resonance imaging data.

31. An apparatus for magnetic resonance imaging, comprising: (a) a magnetic resonance scanner; (b) a computer processor operably coupled to the scanner; and (c) a non-transitory computer-readable memory storing instructions executable by the computer processor; (d) wherein said instructions, when executed by the computer processor, perform steps comprising: (i) obtaining $T_1$ values of a reference region of a tissue at approximately 3T or higher; (ii) mapping $B_1^+$ values of the reference region of tissue; and (iii) measuring $T_1$ and $B_1^+$ maps of a non-reference target region of a tissue simultaneously with Region Variable Flip Angle (RR-VFA) using; and (iv) using measured $T_1$ and $B_1^+$ values with dynamic contrast-enhanced MRI (DCE-MRI) or Multi-parametric MRI (mp-MRI) to form an image of the target region of tissue.

32. A computer implemented method for magnetic resonance imaging, the method comprising: (a) obtaining $T_1$ values of a reference region of a tissue at approximately 3T or higher with an MRI imager; (b) mapping $B_1^+$ values of the reference region of tissue; (c) measuring $T_1$ and $B_1^+$ maps of a non-reference target region of a tissue simultaneously with Region Variable Flip Angle (RR-VFA) using; and (d) using measured $T_1$ and $B_1^+$ values with dynamic contrast-enhanced MRI (DCE-MRI) or Multi-parametric MRI (mp-MRI) to form an image of the target region of tissue; (e) wherein said method is performed by a computer processor executing instructions stored on a non-transitory computer-readable medium.

Although the description herein contains many details, these should not be construed as limiting the scope of the disclosure but as merely providing illustrations of some of the presently preferred embodiments. Therefore, it will be appreciated that the scope of the disclosure fully encompasses other embodiments which may become obvious to those skilled in the art.

In the claims, reference to an element in the singular is not intended to mean "one and only one" unless explicitly so stated, but rather "one or more." All structural, chemical, and functional equivalents to the elements of the disclosed embodiments that are known to those of ordinary skill in the art are expressly incorporated herein by reference and are intended to be encompassed by the present claims. Furthermore, no element, component, or method step in the present disclosure is intended to be dedicated to the public regardless of whether the element, component, or method step is explicitly recited in the claims. No claim element herein is to be construed as a "means plus function" element unless the element is expressly recited using the phrase "means for". No claim element herein is to be construed as a "step plus function" element unless the element is expressly recited using the phrase "step for".

TABLE 1

| Region | $A_{RR-VFA}$ (%) (Range) | $A_{REF}$ (%) (Range) | $T_{1non}$ (ms) (Range) | $T_{1RR-VFA}$ (ms) (Range) | $T_{1REF}$ (ms) (Range) |
|---|---|---|---|---|---|
| Prostate | 102.6 ± 8.5 (90.7-121.4) | 105.4 ± 5.5 (96.9-115.7) | 2112 ± 333 (1560-2615) | 1998 ± 113 (1812-2159) | 1900 ± 190 (1480-2107) |
| Muscle (L) | 108.9 ± 6.69 (98.5-121.2) | 109.4 ± 5.6 (97.4-115.3) | 1722 ± 229 (1282-2068) | 1443 ± 70 (1325-1563) | 1443 ± 123 (1199-1587) |
| Muscle (R) | 102.2 ± 8.75 (86.5-118.0) | 104.9 ± 6.8 (96.6-115.7) | 1557 ± 275 (1015-1934) | 1440 ± 67 (1353-1550) | 1371 ± 134 (1065-1503) |

TABLE 2A

| Parameter | Scanner 1 $A_{RR-VFA}$(%) Mean ± SD/ (min-max) | Scanner 2 $A_{RR-VFA}$ (%) Mean ± SD/ (min-max) | Scanner 3 $A_{RR-VFA}$(%) Mean ± SD/ (min-max) |
|---|---|---|---|
| Volunteer A | 95.6 ± 4.5 (88-105) | 86.9 ± 2.22 (81-91) | 96.6 ± 1.75 (93-100) |
| Volunteer B | 99.4 ± 2.31 (95-105) | 96.4 ± 5.39 (86-108) | 100.5 ± 1.65 (98-104) |
| Volunteer C | 101.2 ± 1.54 (96-105) | 87.5 ± 2.28 (82-92) | 90.3 ± 1.29 (86-93) |
| Volunteer D | 96.9 ± 1.76 (94-101) | 91.0 ± 2.87 (85-97) | 103.0 ± 2.15 (95-106) |
| Mean ± SD | 98.3 ± 2.5 | 90.5 ± 4.4 | 97.6 ± 5.5 |

TABLE 2B

| Parameter | $A_{RR-VFA}$(%) (min-max)/ Range | $T_{1non}$ (ms) (min-max)/ Range | CoV % ($T_{1non}$) | $T_{1RR-VFA}$ (ms) (min-max)/ Range |
|---|---|---|---|---|
| Volunteer A | 86.9-96.6/9.7 | 1530-1772/242 | 8.23 | 1902-2029/127 |
| Volunteer B | 96.4-100.5/4.1 | 1844-2084/240 | 6.25 | 1995-2063/68 |
| Volunteer C | 87.5-101.2/13.7 | 1260-2119/859 | 27.75 | 1646-2072/426 |
| Volunteer D | 91.0-103.0/12.0 | 1469-2028/559 | 15.96 | 1779-1910/131 |

What is claimed is:

1. An apparatus for parametric imaging of a target tissue, comprising:
 (a) a processor configured for receiving MRI scan data from an MRI scanner configured for generating scans on a specific anatomical location, and reference tissue region data; and
 (b) a non-transitory memory storing instructions executable by the processor;
 (c) wherein said instructions, when executed by the processor, perform steps for parametric mapping of the target tissue comprising:
  (i) acquiring MRI scans having one or more images of the target tissue and surrounding target tissues by performing quantitative dynamic contrast-enhanced magnetic resonance imaging (DCE-MRI) at 3T using three-dimensional RF-spoiled gradient echo images with variable flip angles (VFA) to generate the parametric map comprising $T_1$ measurements, wherein said target tissue comprises a tissue, having an unknown or variable imaging characteristic or parameter;
  (ii) receiving characteristics of an internally or externally added reference tissue region comprising a fat tissue in proximity to or at least partially surrounding the target tissue;
  (iii) identifying and characterizing the reference tissue region within the one or more acquired images, the reference tissue region being adjacent or in proximity to the target tissue within a field of view of the one or more images, the reference tissue region having a known and consistent characteristic parameter within the one or more images and having a consistent characteristic parameter that is known or readily estimated;
  (iv) utilizing the reference region with its consistent characteristic parameter within a recognized model to generate a tissue mask from which an unknown tissue parameter is estimated for the target tissue;
  (v) interpolating the estimated unknown tissue parameter of the reference region over the entire field of view of the one or more images; and
  (vi) outputting image data of the one or more images, the image data comprising a parametric map of the target tissue.

2. The apparatus of claim 1, wherein the target tissue comprises a prostate tissue which is typically devoid of fat tissue.

3. The apparatus of claim 1:
 wherein $T_1$ measurements are susceptible to $B_1^+$ field inhomogeneity comprising errors due to spatial variations in flip angle caused by transmit radiofrequency (RF) from the quantitative DCE-MRI; and
 wherein outputting image data comprises simultaneously mapping $T_1$ and $B_1^+$ field inhomogeneity values associated with the target tissue.

4. The apparatus of claim 3:
 wherein calculating the unknown parameter in the reference region comprises estimating $B_1^+$ field inhomogeneity in the fat tissue; and
 wherein interpolating the calculated unknown parameter of the reference region comprises interpolating the estimating $B_1^+$ inhomogeneity over at least a portion of the FOV of the one or more images, the portion comprising the target tissue.

5. The apparatus of claim 1:
 wherein the consistent characteristic parameter comprises an effective fat $T_1$ value associated with the reference region; and
 wherein the unknown parameter of the reference region comprises an rFA value associated with the reference region.

6. The apparatus of claim 5, wherein identifying and characterizing a reference tissue region comprises:
 applying a combination of a user-selectable parameter for fat signal segmentation and a signal fat-fraction threshold; and
 building a binary fat tissue mask of the reference tissue region.

7. The apparatus of claim 6, wherein Dixon-separated fat and water images are used to build the binary fat mask.

8. The apparatus of claim 6:
 wherein the binary fat mask is used to characterize an rFA value associated with the reference region; and
 wherein interpolating the calculated unknown parameter of the reference region comprises interpolating the rFA value at least a portion of the FOV of the one or more images, the portion comprising the target tissue.

9. The apparatus of claim 8, wherein the rFA value comprises $B_1^+$ field inhomogeneity.

10. The apparatus of claim 6, wherein interpolating the calculated unknown parameter of the reference region comprises computing a fractional volume of outliers comprising a combination of user-selectable parameter for fat signal segmentation, the signal fat-fraction threshold, and effective fat $T_1$ values.

11. A method for parametric imaging of a target tissue, comprising:
 (a) acquiring MRI scans having one or more images of the target tissue and surrounding target tissues by performing quantitative dynamic contrast-enhanced magnetic resonance imaging (DCE-MRI) at 3T using three-dimensional RF-spoiled gradient echo images with variable flip angles (VFA) to generate the parametric map comprising $T_1$ measurements, wherein said target tissue comprises a tissue, having an unknown or variable characteristic parameter;
 (b) receiving characteristics of an internally or externally added reference tissue region comprising a fat tissue in proximity to or at least partially surrounding the target tissue;
 (c) identifying and characterizing the reference tissue region within the one or more acquired images, the reference tissue region being adjacent or in proximity to the target tissue within a field of view of the one or more images, the reference tissue region having a known and consistent characteristic parameter within the one or more images and having a consistent characteristic parameter that is known or readily estimated;

(d) utilizing the reference region with its consistent characteristic parameter within a recognized model to generate a tissue mask from which an unknown tissue parameter is estimated for the target tissue;

(e) interpolating the estimated unknown tissue parameter of the reference region over the entire field of view of the one or more images; and (f) outputting image data of the one or more images, the image data comprising a parametric map of the target tissue;

(g) wherein said method is performed by a processor, configured for receiving MRI scan data from an MRI scanner configured for generating scans on a specific anatomical location, and reference tissue region data, for executing instructions stored on a non-transitory medium.

12. The method of claim 11, wherein the target tissue comprises a prostate tissue which is typically devoid of fat tissue.

13. The method of claim 11:

wherein $T_1$ measurements are susceptible to $B_1^+$ field inhomogeneity comprising errors due to spatial variations in flip angle caused by transmit radiofrequency (RF) from the quantitative DCE-MRI; and wherein outputting image data comprises simultaneously mapping $T_1$ and $B_1^+$ field inhomogeneity values associated with the target tissue.

14. The method of claim 13:

wherein calculating the unknown parameter in the reference region comprises estimating $B_1^+$ field inhomogeneity in the fat tissue; and wherein interpolating the calculated unknown parameter of the reference region comprises interpolating the estimating $B_1^+$ inhomogeneity over at least a portion of the FOV of the one or more images, the portion comprising the target tissue.

15. The method of claim 11:

wherein the consistent characteristic parameter comprises an effective fat $T_1$ value associated with the reference region; and wherein the unknown parameter of the reference region comprises an rFA value associated with the reference region.

16. The method of claim 15, wherein identifying and characterizing a reference tissue region comprises:

applying a combination of a user-selectable parameter for fat signal segmentation and a signal fat-fraction threshold; and building a binary fat tissue mask of the reference tissue region.

17. The method of claim 16, wherein Dixon-separated fat and water images are used to build the binary fat mask.

18. The method of claim 16:

wherein the binary fat mask is used to characterize an rFA value associated with the reference region; and wherein interpolating the calculated unknown parameter of the reference region comprises interpolating the rFA value at least a portion of the FOV of the one or more images, the portion comprising the target tissue.

19. The method of claim 18, wherein the rFA value comprises $B_1^+$ field inhomogeneity.

20. The method of claim 16, wherein interpolating the calculated unknown parameter of the reference region comprises computing a fractional volume of outliers comprising a combination of user-selectable parameter for fat signal segmentation, the signal fat-fraction threshold and effective fat $T_1$ values.

* * * * *